United States Patent
Kim et al.

(10) Patent No.: US 12,464,646 B2
(45) Date of Patent: Nov. 4, 2025

(54) ELECTRONIC DEVICE INCLUDING PRINTED CIRCUIT BOARD

(71) Applicant: SAMSUNG ELECTRONICS CO., LTD., Suwon-si (KR)

(72) Inventors: Juho Kim, Suwon-si (KR); Woochul Park, Suwon-si (KR); Dongyeol Kwak, Suwon-si (KR); Juwon Kim, Suwon-si (KR); Yousok Min, Suwon-si (KR); Wonbin Jo, Suwon-si (KR); Sooyong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 230 days.

(21) Appl. No.: 18/372,937

(22) Filed: Sep. 26, 2023

(65) Prior Publication Data
US 2024/0080982 A1    Mar. 7, 2024

Related U.S. Application Data

(63) Continuation of application No. PCT/KR2023/011629, filed on Aug. 8, 2023.

(30) Foreign Application Priority Data

Sep. 5, 2022  (KR) .................. 10-2022-0112215
Oct. 12, 2022 (KR) .................. 10-2022-0130423

(51) Int. Cl.
*H05K 1/14*   (2006.01)
*H05K 1/11*   (2006.01)

(52) U.S. Cl.
CPC ............ *H05K 1/144* (2013.01); *H05K 1/115* (2013.01); *H05K 2201/042* (2013.01); *H05K 2201/10378* (2013.01)

(58) Field of Classification Search
CPC .................. H05K 1/144; H05K 1/115; H05K 2201/10378; H05K 2201/09063
See application file for complete search history.

(56) References Cited

U.S. PATENT DOCUMENTS

2003/0042617 A1   3/2003  Lee
2004/0087061 A1   5/2004  Ma et al.
(Continued)

FOREIGN PATENT DOCUMENTS

JP       2015-95562 A      5/2015
KR  10-2008-0063989 A     7/2008
(Continued)

OTHER PUBLICATIONS

International Search Report dated Nov. 13, 2023 in International Application No. PCT/KR2023/011629.
(Continued)

*Primary Examiner* — Paresh Paghadal
(74) *Attorney, Agent, or Firm* — Sughrue Mion, PLLC

(57) ABSTRACT

An electronic device includes a housing including a front surface, a rear surface that is opposite to the front surface, and a side surface enclosing an inner space between the front surface and the rear surface, a display that is visually exposed to the outside of the electronic device, and a printed circuit board that is in the inner space. The printed circuit board includes a plurality of circuit boards that are parallel to one another and include electrical elements and one or more interposers that are between the plurality of circuit boards and connecting a pair of circuit boards adjacent to each other in a height direction. The one or more interposers include one or more via holes, a via and one or more interposer through holes.

20 Claims, 14 Drawing Sheets

(56) References Cited

U.S. PATENT DOCUMENTS

| | | | |
|---|---|---|---|
| 2005/0218528 A1 | 10/2005 | Beatty et al. | |
| 2011/0024916 A1 | 2/2011 | Marimuthu et al. | |
| 2013/0148322 A1* | 6/2013 | Fosnes | H05K 1/144 29/842 |
| 2014/0027932 A1 | 1/2014 | Brunschwiler et al. | |
| 2021/0022247 A1 | 1/2021 | Ha et al. | |
| 2021/0144856 A1* | 5/2021 | Park | H04M 1/0277 |
| 2021/0195735 A1 | 6/2021 | Mok | |
| 2023/0240020 A1* | 7/2023 | Patel | H05K 1/024 361/696 |

FOREIGN PATENT DOCUMENTS

| | | |
|---|---|---|
| KR | 10-0953857 B1 | 4/2010 |
| KR | 10-2014-0133022 A | 11/2014 |
| KR | 10-2015-0124092 A | 11/2015 |
| KR | 10-2016-0033492 A | 3/2016 |
| KR | 10-1840305 B1 | 3/2018 |
| KR | 10-2021-0136819 A | 11/2021 |
| KR | 10-2022-0102930 A | 7/2022 |
| WO | 2023018180 A1 | 2/2023 |

OTHER PUBLICATIONS

Written Opinion dated Nov. 13, 2023 in International Application No. PCT/KR2023/011629.
Communication dated Jun. 30, 2025, issued by the European Patent Office in counterpart European Application No. 23863358.0.

* cited by examiner

ELECTRONIC DEVICE INCLUDING PRINTED CIRCUIT BOARD

CROSS-REFERENCE TO RELATED APPLICATIONS

This application is a by-pass continuation of International Application No. PCT/KR2023/011629, filed on Aug. 8, 2023, which is based on and claims priority to Korean Patent Application No. 10-2022-0112215, filed on Sep. 5, 2022, and Korean Patent Application No. 10-2022-0130423, filed on Oct. 12, 2022, in the Korean Intellectual Property Office, the disclosures of which are incorporated by reference herein in their entireties.

BACKGROUND

1. Field

The disclosure relates to an electronic device including a printed circuit board.

2. Description of Related Art

Technology has been developed to improve the efficiency of mounting space and/or wiring space in an electronic device by efficiently arranging a plurality of electrical/electronic components in the electronic device.

SUMMARY

According to an aspect of the disclosure, an electronic device includes: a housing including a front surface, a rear surface that is opposite to the front surface, and a side surface enclosing an inner space between the front surface and the rear surface; and a printed circuit board disposed within the inner space, wherein the printed circuit board includes: a plurality of circuit boards that are substantially parallel to one another and include one or more electrical elements; and one or more interposers disposed between the plurality of circuit boards and connecting a pair of circuit boards, among the plurality of circuit boards, adjacent to each other in a height direction, wherein the pair of circuit boards are separated from the one or more interposers by a gap, and one or more board through holes are formed in a height direction through at least one of the plurality of circuit boards, wherein the one or more interposers include: one or more via holes formed in the height direction through the one or more interposers; a via disposed within a via hole of the one or more via holes and configured to electrically connect the pair of circuit boards; and one or more interposer through holes formed in the height direction through the one or more interposers and configured to respectively communicate with the one or more board through holes of the pair of circuit boards, and wherein the printed circuit board further includes a non-conductive filler disposed within the gap.

The plurality of circuit boards may further include a first circuit board including a first board surface and a second board surface that is on a side of the first circuit board opposite to the first board surface; and a second circuit board including a third board surface that is substantially parallel to the first circuit board and faces the second board surface and a fourth board surface that is on a side of the second circuit board opposite to the third board surface. The one or more interposers may further include a first interposer disposed between the first circuit board and the second circuit board. The first circuit board further may include a first board through hole from among the one or more board through holes, the first interposer may include a first interposer through hole from among the one or more interposer through holes, and the first interposer through hole may be in communication with the first board through hole.

The second circuit board may further include a second board through hole from among the one or more board through holes, and the second board through hole may be in communication with the first interposer through hole.

A cross-sectional area of the one or more board through holes may be different from a cross-sectional area of the one or more interposer through holes when viewed from the height direction.

The printed circuit board may be configured to receive the non-conductive filler through the one or more board through holes and the one or more interposer through holes in a liquid state and to allow the liquid non-conductive filler to flow through the gap.

The plurality of circuit boards may further include: a first circuit board including a first board surface and a second board surface that is on a side of the first circuit board opposite to the first board surface; a second circuit board including a third board surface that is substantially parallel to the first circuit board and faces the second board surface and a fourth board surface that is on a side of the second circuit board opposite to the third board surface; and a third circuit board including a fifth board surface that is substantially parallel to the first circuit board and faces the fourth board surface and a sixth board surface that is on a side of the third circuit board opposite to the fifth board surface, wherein the second circuit board may be disposed between the first circuit board and the fifth board surface, and wherein the one or more interposers may further include: a first interposer disposed between the first circuit board and the second circuit board; and a second interposer disposed between the second circuit board and the third circuit board.

The first circuit board may further include a first board through hole from among the one or more board through holes, and the first interposer may include a first interposer through hole from among the one or more interposer through holes. The second circuit board may further include a second board through hole from among the one or more board through holes, and the second interposer may include a second interposer through hole from among the one or more interposer through holes. The first board through hole may be formed through the first circuit board from the first board surface to the second board surface, and the second board through hole may be formed through the second circuit board from the first board surface to the second board surface. The first interposer through hole may be formed through the first interposer in the height direction and may be in communication with the first board through hole and the second board through hole, and the second interposer through hole may be formed through the second interposer in the height direction and may be in communication with the second board through hole.

The first interposer through hole may be in communication with the second interposer through hole through a gap between the first interposer and the second circuit board.

The second interposer through hole may not overlap with the first interposer through hole when viewed from the height direction.

The third circuit board may further include a third board through hole from among the one or more board through holes, the third board through hole may be formed through the third circuit board from the fifth board surface to the sixth board surface, and the third board through hole may be in communication with the second interposer through hole.

The second interposer through hole may not overlap with the third board through hole when viewed from the height direction.

A cross-sectional shape of the one or more board through holes may be substantially circular or polygonal when viewed from the height direction, and a cross-sectional shape of the one or more interposer through holes may be substantially circular or polygonal when viewed from the height direction.

At least one of the one or more board through holes and at least one of the one or more interposer through holes may overlap when viewed from the height direction and may have a substantially similar cross-sectional shape when viewed from the height direction.

The one or more interposers may be disposed along a perimeter of the plurality of circuit boards, and the printed circuit board may be configured to receive the non-conductive filler through the one or more board through holes and the one or more interposer through holes in a liquid state and to allow the liquid non-conductive filler to flow through the gap around the perimeter of the plurality of circuit boards.

When viewed from the height direction, an edge of the plurality of circuit boards and an edge of the one or more interposers may be substantially aligned.

According to an aspect of the disclosure, a printed circuit board includes: a first circuit board including a first board surface and a second board surface on a side of the first circuit board that is opposite to the first board surface; a second circuit board including a third board surface that is substantially parallel to the first circuit board and faces the second board surface and a fourth board surface on a side of the second circuit board that is opposite to the third board surface; and a first interposer disposed between the first circuit board and the second circuit board and connecting the first circuit board to the second circuit board in a height direction that is perpendicular to the first board surface, wherein a first gap configured to receive a liquid non-conductive filler is formed between the first interposer and the first circuit board, and a second gap configured to receive the liquid non-conductive filler is formed between the first interposer and the second circuit board, wherein one or more board through holes are formed through at least one of the first circuit board and the second circuit board in the height direction, wherein the first interposer includes: one or more via holes formed in the height direction through the first interposer; a via disposed within a via hole of the one or more via holes and configured to electrically connect the first circuit board to the second circuit board; and one or more first interposer through holes formed in the height direction through the first interposer and configured to respectively communicate with the one or more board through holes, and wherein the printed circuit board further includes the non-conductive filler in a non-liquid state disposed within the first gap and the second gap.

The one or more board through holes may include at least one of: a first board through hole formed through the first circuit board from the first board surface to the second board surface; and a second board through hole formed through the second circuit board from the third board surface to the fourth board surface. At least one of the first board through hole and the second board through hole may be in communication with at least one of the one or more first interposer through holes.

According to an aspect of the disclosure, a printed circuit board includes: a first circuit board including a first board surface, and a second board surface that is on a side of the first circuit board opposite to the first board surface; a second circuit board including a third board surface that is substantially parallel to the first circuit board and faces the second board surface, and a fourth board surface that is on a side of the second circuit board opposite to the third board surface; a third circuit board including a fifth board surface that is substantially parallel to the first circuit board and faces the fourth board surface, and a sixth board surface that is on a side of the third circuit board opposite to the fifth board surface, wherein the second circuit board is disposed between the first circuit board and the fifth board surface; a first interposer disposed between the first circuit board and the second circuit board and connecting the first circuit board to the second circuit board in a height direction that is perpendicular to the first board surface; and a second interposer disposed between the second circuit board and the third circuit board and connecting the second circuit board to the third circuit board in a height direction that is perpendicular to the third board surface, wherein the first interposer and the first circuit board are separated by a first gap, the first interposer and the second circuit board are separated by a second gap, the second interposer and the second circuit board are separated by a third gap, and the second interposer and the third circuit board are separated by a fourth gap, wherein one or more board through holes are formed through at least one of the first circuit board, the second circuit board, and the third circuit board in the height direction, wherein the first interposer includes: a first via hole formed through the first interposer in the height direction; a first via disposed within the first via hole and configured to electrically connect the first circuit board to the second circuit board; and a first interposer through hole formed through the first interposer in the height direction and configured to communicate with the one or more board through holes, wherein the second interposer includes: a second via hole formed through the second interposer in the height direction; a second via disposed within the second via hole and configured to electrically connect the second circuit board to the third circuit board; and a second interposer through hole formed through the second interposer in the height direction and configured to communicate with the one or more board through holes, wherein the first gap, the second gap, the third gap, and the fourth gap are configured to receive a non-conductive filler through the one or more board holes and at least one of the first interposer through hole and the second interposer through hole, and wherein the printed circuit board further includes the non-conductive filler disposed within the first gap, the second gap, the third gap, and the fourth gap.

The one or more board through holes may include at least one of: a first board through hole formed through the first circuit board from the first board surface to the second board surface; a second board through hole formed through the second circuit board from the third board surface to the fourth board surface; and a third board through hole formed through the third circuit board from the fifth board surface to the sixth board surface, and at least one of the first board through hole, the second board through hole, and the third board through hole may be in communication with at least one of the first interposer through hole and the second interposer through hole.

The second interposer through hole may not overlap with the first interposer through hole when viewed from the height direction.

According to an aspect of the disclosure, a printed circuit board includes: a first circuit board including a first board through hole; a second circuit board that is substantially parallel to the first circuit board; an interposer including an interposer through hole and a via, wherein the interposer is disposed between the first circuit board and the second circuit board; a first joining member disposed between the first circuit board and the interposer and electrically connected to the via and the first circuit board; and a second joining member disposed between the second circuit board and the interposer and electrically connected to the via and the second circuit board, wherein a first gap is formed between the first circuit board and the interposer and a second gap is formed between the second circuit board and the interposer, and wherein the printed circuit board is configured to receive a liquid non-conductive filler through one or more of the first board through hole, the interposer through hole, the first gap, and the second gap.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
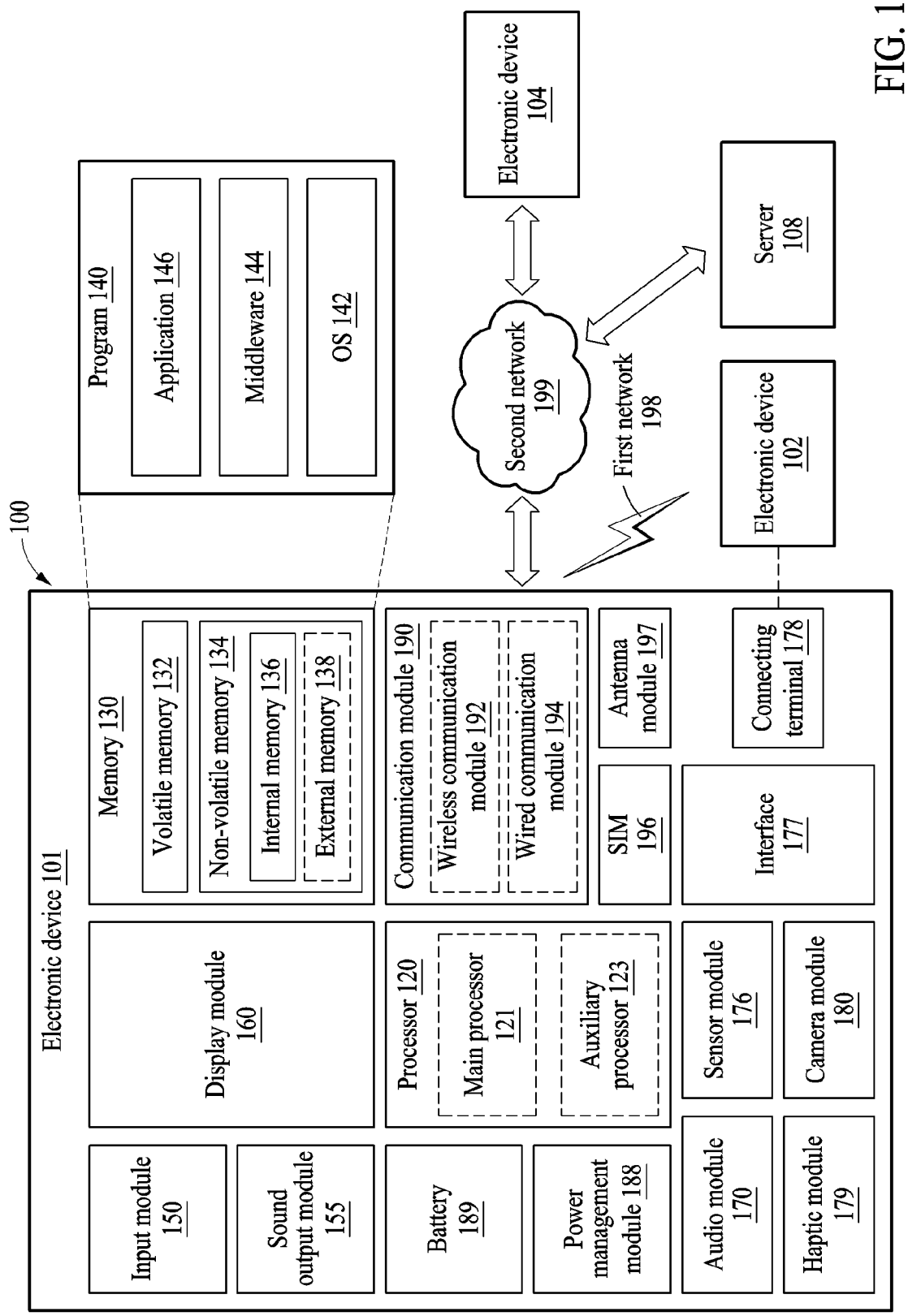
FIG. 1 is a block diagram illustrating an electronic device in a network environment according to an embodiment.

Hereinafter, embodiments will be described in detail with reference to the accompanying drawings. When describing the embodiments with reference to the accompanying drawings, like reference numerals refer to like elements, and a repeated description related thereto will be omitted.

FIG. 1 is a block diagram illustrating an electronic device in a network environment according to an embodiment. Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented as separate from, or as part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123. According to an embodiment, the auxiliary processor 123 (e.g., an NPU) may include a hardware structure specified for artificial intelligence model processing. An artificial intelligence model may be generated through machine learning. Such learning may be performed, for example, by the electronic device 101 in which an artificial intelligence model is executed, or via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The artificial intelligence model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to sense a touch, or a pressure sensor adapted to measure the intensity of force incurred by the touch.

The audio module 170 may convert a sound into an electrical signal and vice versa. According to an embodiment, the audio module 170 may obtain the sound via the input module 150 or output the sound via the sound output module 155 or an external electronic device (e.g., the electronic device 102 such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, ISPs, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently of the processor 120 (e.g., an AP) and that support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beamforming, or a large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a PCB, an RFIC disposed on a first surface (e.g., the bottom surface) of the PCB or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an embodiment, all or some of operations to be executed at the electronic device 101 may be executed at one or more of external electronic devices (e.g., the external electronic devices 102 and 104, or the server 108). For example, if the electronic device 101 needs to perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In an embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to the embodiments disclosed herein may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic device is not limited to those described above.

Figure 2A:
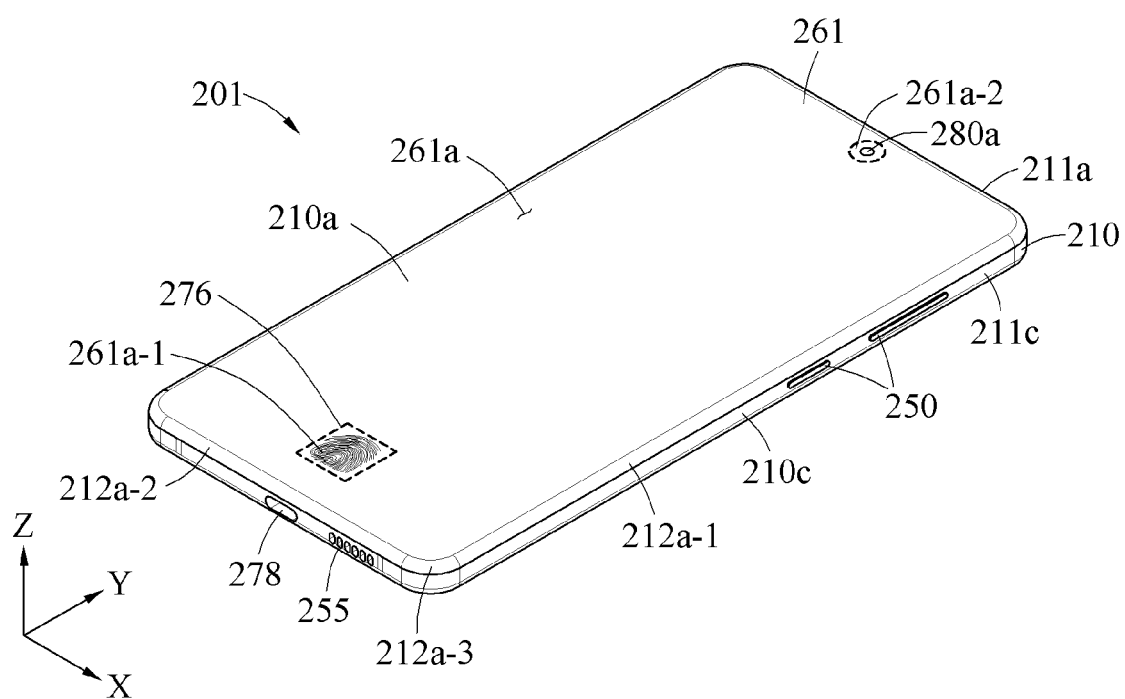
FIG. 2A is a perspective view of an electronic device viewed from one direction according to an embodiment.
Figure 2B:
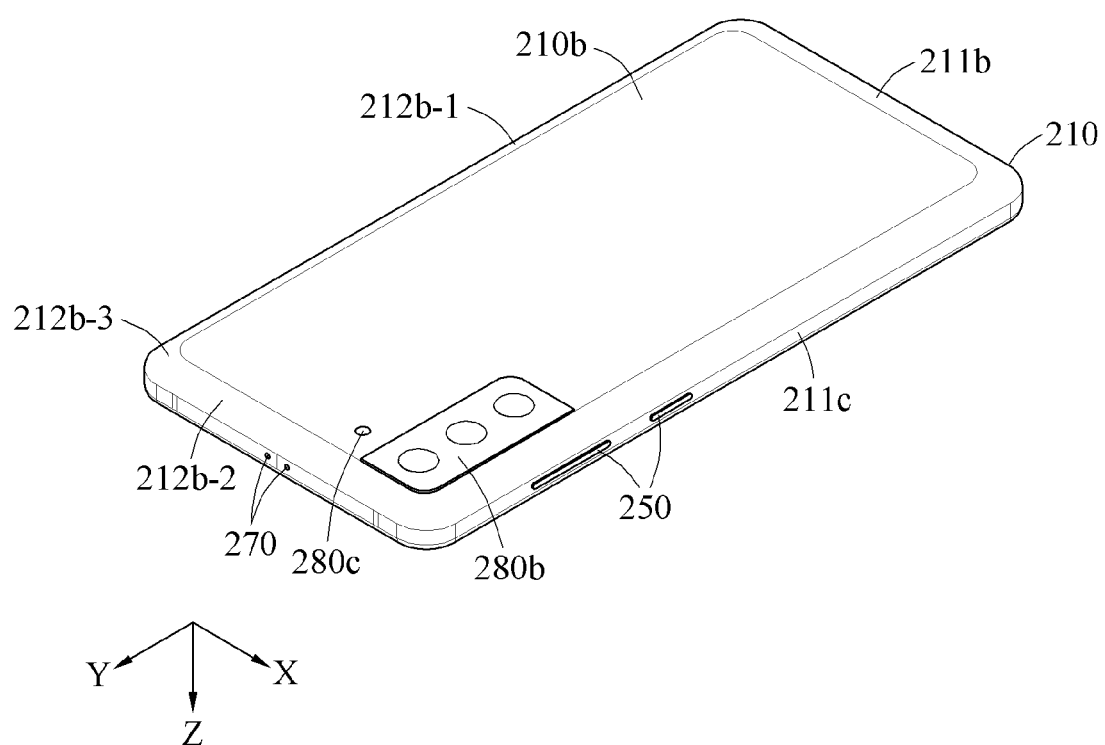
FIG. 2B is a perspective view of an electronic device viewed from another direction according to an embodiment.
Figure 2C:
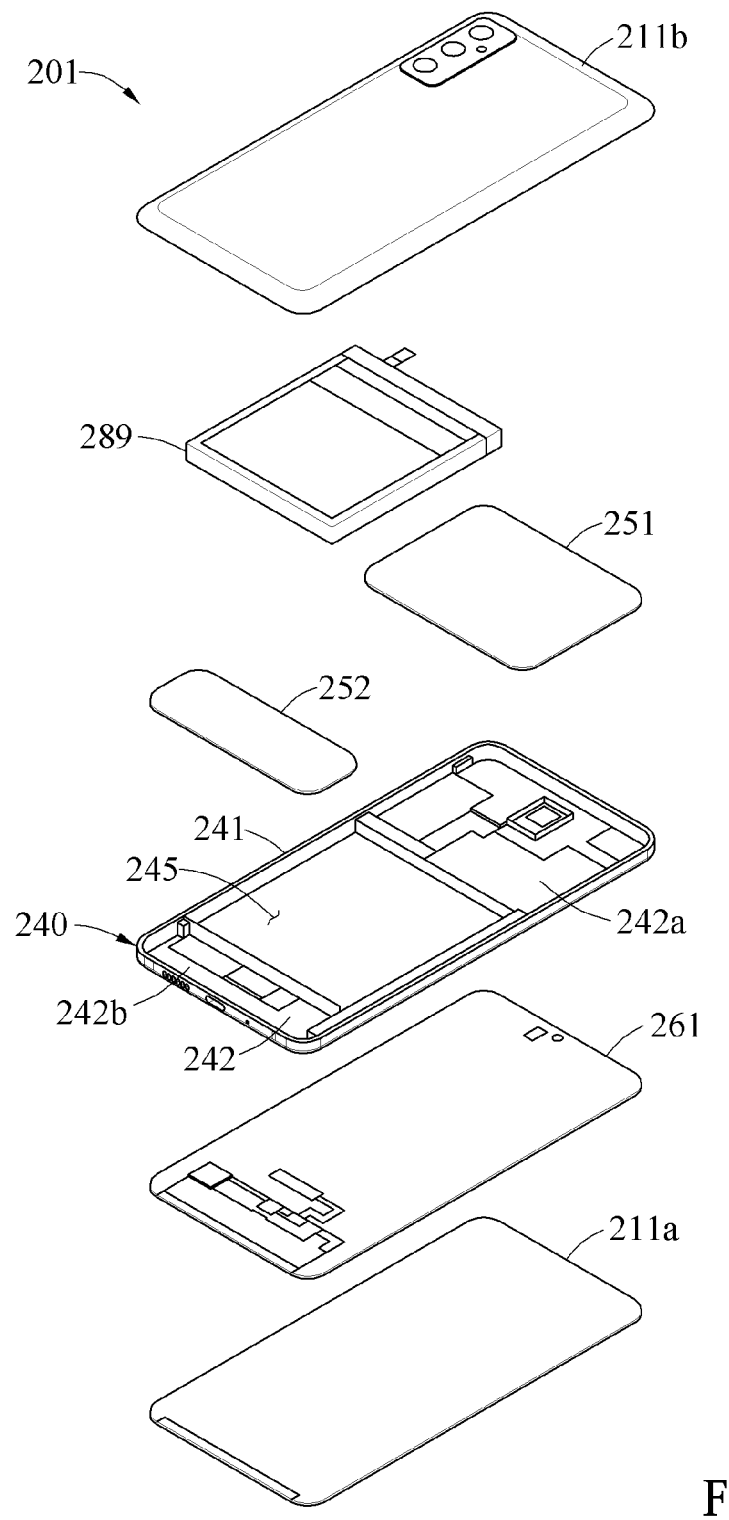
FIG. 2C is an exploded perspective view of an electronic device according to an embodiment.

FIG. 2A is a perspective view of an electronic device viewed from one direction according to an embodiment, FIG. 2B is a perspective view of an electronic device viewed from another direction according to an embodiment, and FIG. 2C is an exploded perspective view of an electronic device according to an embodiment.

Referring to FIGS. 2A to 2C, an electronic device 201 (e.g., the electronic device 101) may include a housing 210 including a first surface 210a (e.g., a front surface), a second surface 210b (e.g., a rear surface), and a third surface 210c (e.g., a side surface) enclosing a space between the first surface 210a and the second surface 210b.

In an embodiment, the first surface 210a may be formed by a first plate 211a of which at least a portion is substantially transparent. For example, the first plate 211a may include a polymer plate or a glass plate including at least one coating layer. The second surface 210b may be formed by a second plate 211b that is substantially opaque. For example, the second plate 211b may be formed of coated or tinted glass, ceramic, polymer, metal (e.g., aluminum, stainless steel (STS), or magnesium), or a combination thereof. The third surface 210c may be formed by a frame 211c that is coupled to the first plate 211a and the second plate 211b and that includes a metal and/or a polymer. In an embodiment, the second plate 211b and the frame 211c may be integrally and seamlessly formed. In an embodiment, the second plate 211b and the frame 211c may be formed of substantially the same material (e.g., aluminum).

In an embodiment, the first plate 211a may include a plurality of first periphery areas 212a-1 that are rounded in a direction from at least one area of the first surface 210a toward the second plate 211*b* and extend in one direction (e.g., a +/−Y direction), a plurality of second periphery areas 212*a*-2 that are rounded in the direction from at least one area of the first surface 210*a* toward the second plate 211*b* and extend in another direction (e.g., a +/−X direction), and a plurality of third periphery areas 212*a*-3 that are rounded in the direction from at least one area of the first surface 210*a* toward the second plate 211*b* and positioned between the plurality of first periphery areas 212*a*-1 and the plurality of second periphery areas 212*a*-2. In an embodiment, the second plate 211*b* may include a plurality of fourth periphery areas 212*b*-1 that are rounded in a direction from at least one area of the second surface 210*b* toward the first plate 211*a* and extend in one direction (e.g., the +/−Y direction), a plurality of fifth periphery areas 212*b*-2 that are rounded in the direction from at least one area of the second surface 210*b* toward the first plate 211*a* and extend in the other direction (e.g., the +/−X direction), and a plurality of sixth periphery areas 212*b*-3 that are rounded in the direction from at least one area of the second surface 210*b* toward the first plate 211*a* and positioned between the plurality of fourth periphery areas 212*b*-1 and the plurality of fifth periphery areas 212*b*-2.

The electronic device 201 may include a display 261 (e.g., the display module 160). In an embodiment, the display 261 may be positioned on the first surface 210*a*. In an embodiment, the display 261 may be exposed through at least a portion (e.g., the plurality of first periphery areas 212*a*-1, the plurality of second periphery areas 212*a*-2, and the plurality of third periphery areas 212*a*-3) of the first plate 211*a*. In an embodiment, the display 261 may have a shape that is substantially the same as the shape of an outer edge of the first plate 211*a*. In an embodiment, the periphery of the display 261 may substantially coincide with the outer edge of the first plate 211*a*. In an embodiment, the display 261 may include a touch sensing circuit, a pressure sensor for measuring an intensity (pressure) of a touch, and/or a digitizer for detecting a magnetic-type stylus pen. In an embodiment, the display 261 may include a screen display area 261*a* that is visually exposed and displays content through a pixel or a plurality of cells. In an embodiment, the screen display area 261*a* may include a sensing area 261*a*-1 and/or a camera area 261*a*-2. The sensing area 261*a*-1 may overlap at least one area of the screen display area 261*a*. The sensing area 261*a*-1 may allow transmission of an input signal related to a sensor module 276 (e.g., the sensor module 176). The sensing area 261*a*-1 may display content, similar to the screen display area 261*a* that does not overlap the sensing area 261*a*-1. For example, the sensing area 261*a*-1 may display the content while the sensor module 276 is not operating. The camera area 261*a*-2 may overlap at least one area of the screen display area 261*a*. The camera area 261*a*-2 may allow transmission of an optical signal related to a first camera module 280*a* (e.g., the camera module 180). The camera area 261*a*-2 may display content, similar to the screen display area 261*a* that does not overlap the camera area 261*a*-2. For example, the camera area 261*a*-2 may display the content while the first camera module 280*a* is not operating.

The electronic device 201 may include an audio module 270 (e.g., the audio module 170). In an embodiment, the audio module 270 may be positioned on the third surface 210*c*. In an embodiment, the audio module 270 may obtain sound through at least one hole.

The electronic device 201 may include the sensor module 276. In an embodiment, the sensor module 276 may be positioned on the first surface 210*a*. The sensor module 276 may form the sensing area 261*a*-1 in at least a portion of the screen display area 261*a*. The sensor module 276 may receive an input signal transmitted through the sensing area 261*a*-1 and generate an electrical signal based on the received input signal. For example, the input signal may have a designated physical quantity (e.g., heat, light, temperature, sound, pressure, or ultrasound). For another example, the input signal may include a signal related to biometric information (e.g., a fingerprint) of a user.

The electronic device 201 may include the first camera module 280*a*, a second camera module 280*b* (e.g., the camera module 180), and a flash 280*c*. In an embodiment, the first camera module 280*a* may be positioned on the first surface 210*a*, and the second camera module 280*b* and the flash 280*c* may be positioned on the second surface 210*b*. In an embodiment, at least a portion of the first camera module 280*a* may be positioned under the display 261. In an embodiment, the first camera module 280*a* may receive an optical signal transmitted through the camera area 261*a*-2. In an embodiment, the second camera module 280*b* may include a plurality of camera modules (e.g., a dual camera, a triple camera, or a quad camera). In an embodiment, the flash 280*c* may include a light-emitting diode or a xenon lamp.

The electronic device 201 may include a sound output module 255 (e.g., the sound output module 155). In an embodiment, the sound output module 255 may be positioned on the third surface 210*c*. In an embodiment, the sound output module 255 may include one or more holes.

The electronic device 201 may include an input module 250 (e.g., the input module 150). In an embodiment, the input module 250 may be positioned on the third surface 210*c*. In an embodiment, the input module 250 may include at least one key input device.

The electronic device 201 may include a connecting terminal 278 (e.g., the connecting terminal 178). In an embodiment, the connecting terminal 278 may be positioned on the third surface 210*c*. For example, when the electronic device 201 is viewed from one direction (e.g., the +Y direction), the connecting terminal 278 may be positioned in a central portion of the third surface 210*c*, and the sound output module 255 may be positioned on one side (e.g., a right side) with respect to the connecting terminal 278.

The electronic device 201 may include the support body 240, the PCBs 251 and 252 and a battery 289 (e.g., the battery 189 of FIG. 1). At least a portion of the support body 240 may form the housing 210 together with the first plate 211*a* and the second plate 211*b*. In an embodiment, the support body 240 may include a frame structure 241 (e.g., the frame 211*c*) and a plate structure 242. The frame structure 241 may be formed to surround the periphery of the plate structure 242. The frame structure 241 may connect the periphery of the first plate 211*a* and the periphery of the second plate 211*b*, surround the space between the first plate 211*a* and the second plate 211*b*, and form the third surface 210*c* of the electronic device 201. The plate structure 242 may include one or more seating portions 242*a* and 242*b* accommodating one or more PCBs 251 and 252. For example, the electronic device 201 may include a first PCB 251 and a second PCB 252, and the plate structure 242 may include a first seating portion 242*a* in which the first PCB 251 seats and a second seating portion 242*b* in which the second PCB 252 seats.

In an embodiment, a display 261 may be on a surface (e.g., a bottom surface) of the plate structure 242, and the first PCB 251 and the second PCB 252 may be on the other surface (e.g., a top surface) of the plate structure 242. In an embodiment, the plate structure 242 may include an opening 245 positioned between the first seating portion 242a and the second seating portion 242b and passing through both surfaces of the plate structure 242. The opening 245 may accommodate the battery 289. Although the electronic device 201 illustrated in FIGS. 2A to 2C has the appearance of a bar type or a plate type, the appearance of the electronic device 201 is not limited to the bar type or the plate type. For example, the electronic device 201 may be a rollable or foldable electronic device. For another example, the electronic device 201 may be a portable electronic device, such as a smartphone, and an electronic device, such as a laptop computer or a home appliance.

Figure 3A:
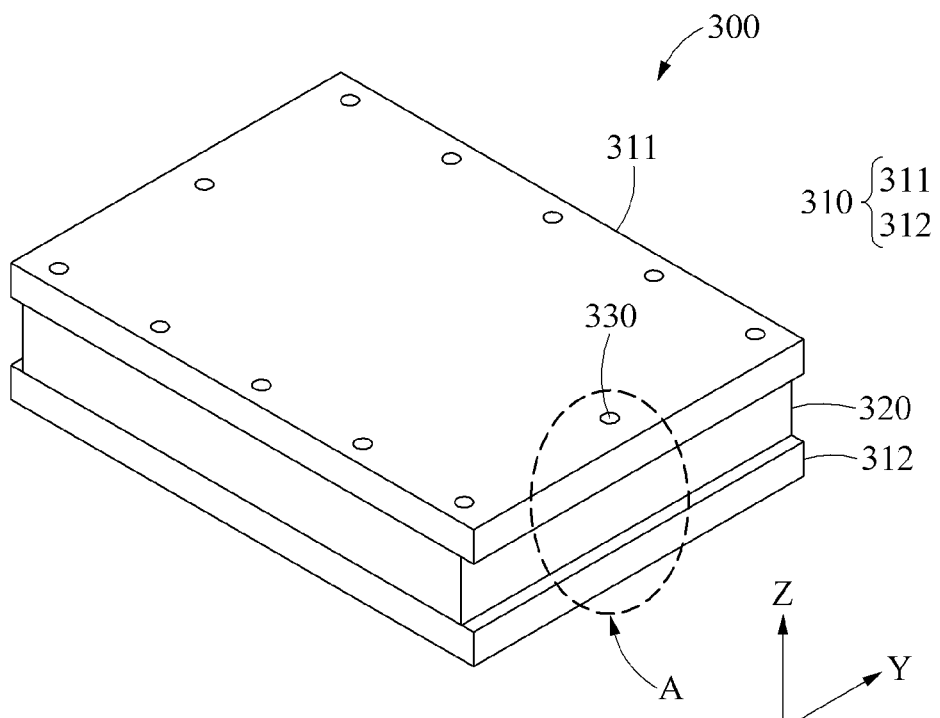
FIG. 3A is a perspective view of a printed circuit board according to an embodiment.
Figure 3B:
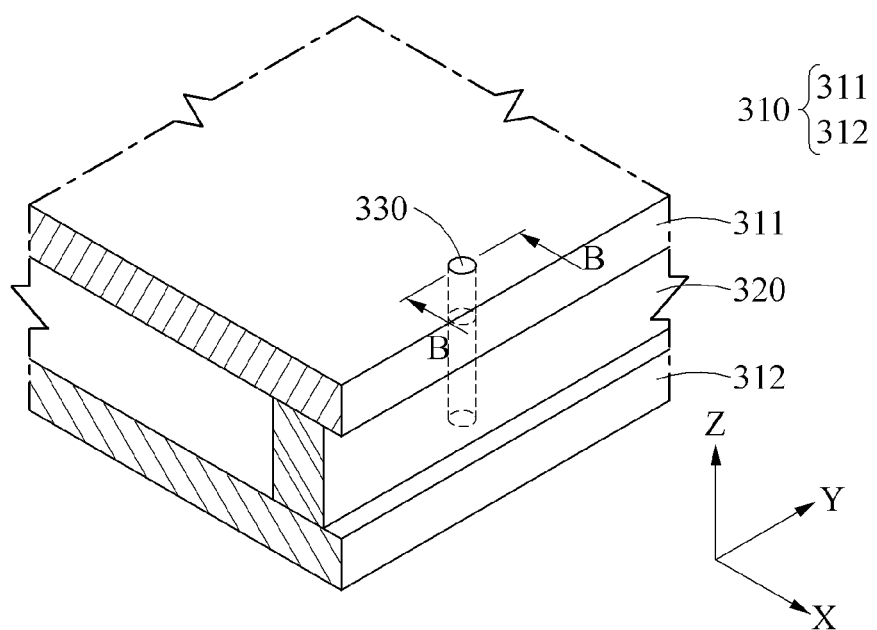
FIG. 3B is an enlarged view of area A of FIG. 3A.
Figure 3C:
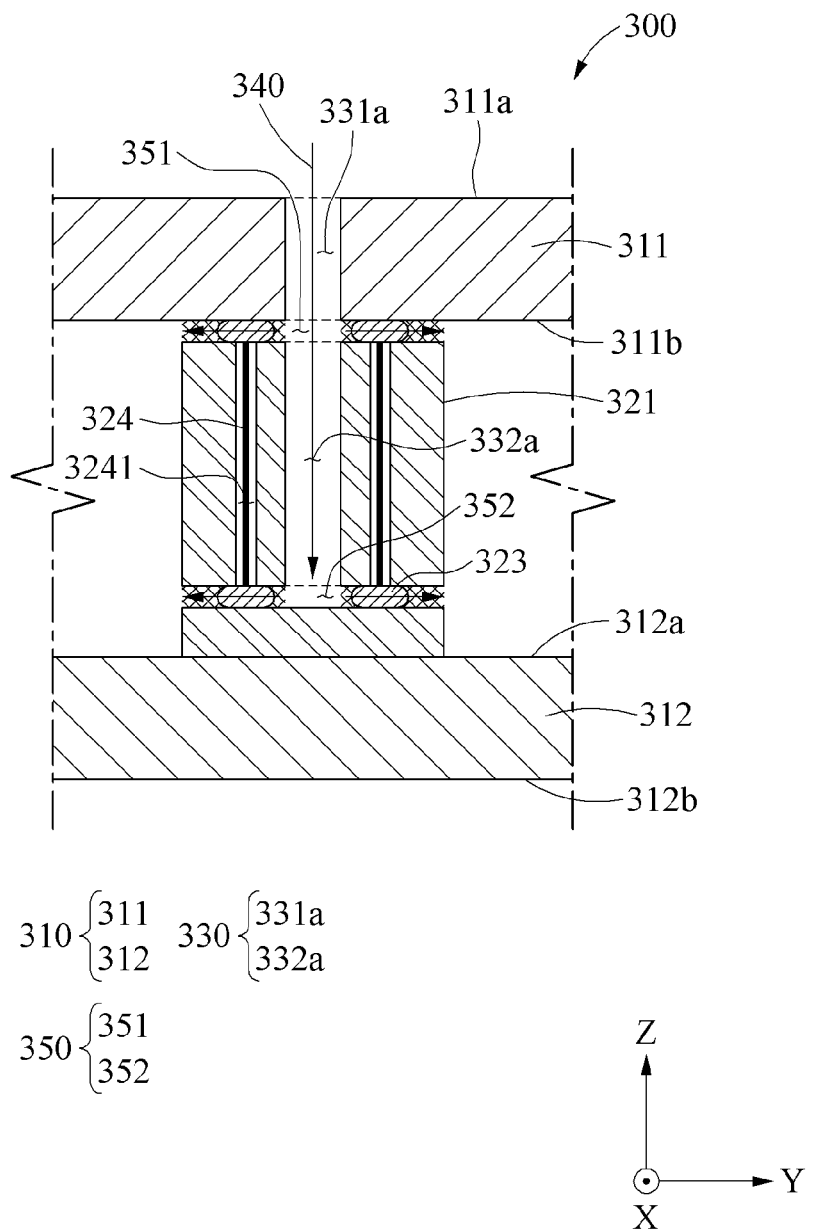
FIG. 3C is a cross-sectional view along line B-B of FIG. 3B.
Figure 3D:
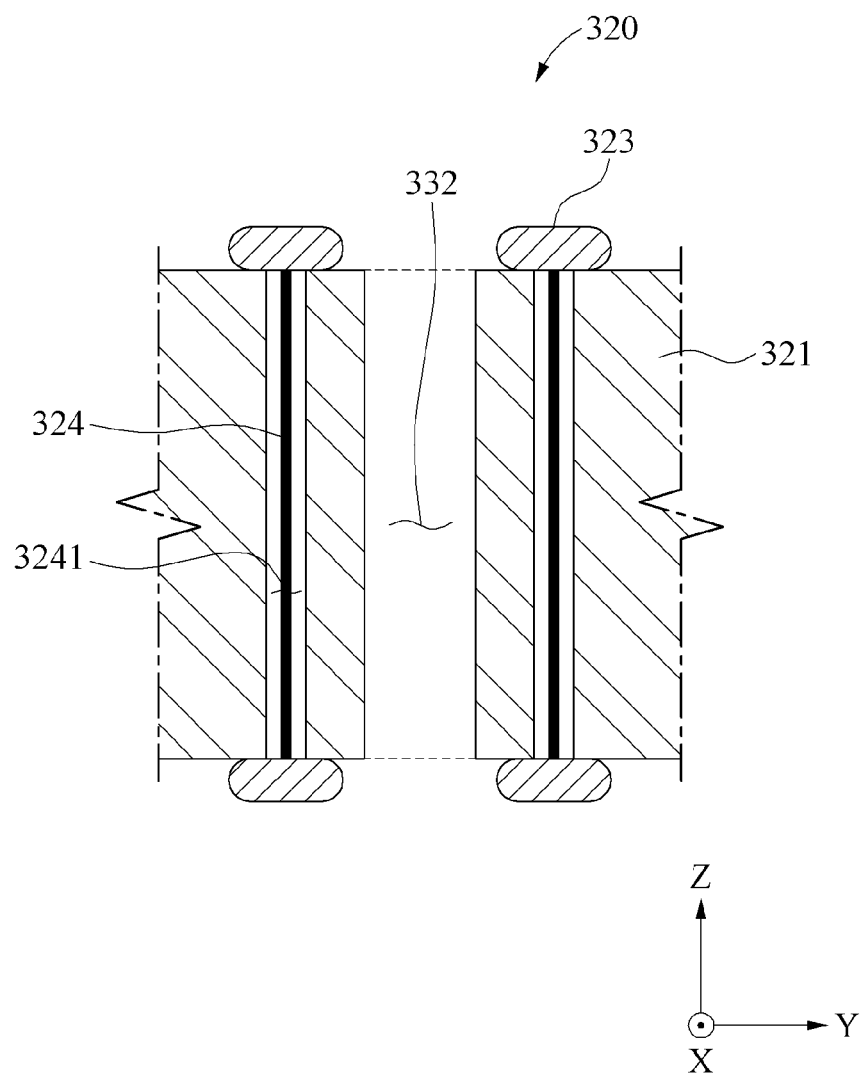
FIG. 3D is a cross-sectional view of an interposer according to an embodiment.
Figure 3E:
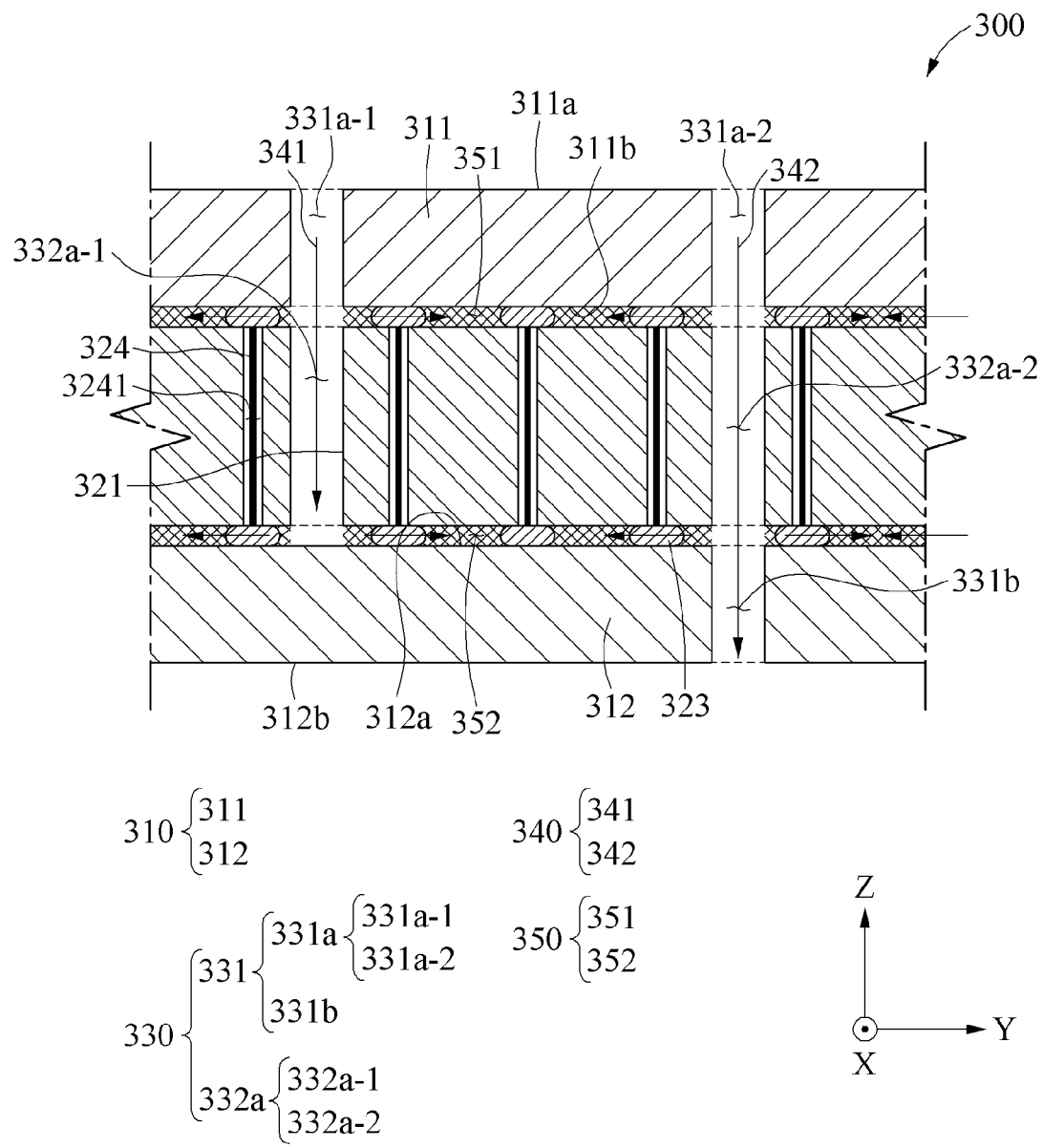
FIG. 3E is a cross-sectional view of the printed circuit board according to an embodiment.
Figure 3F:
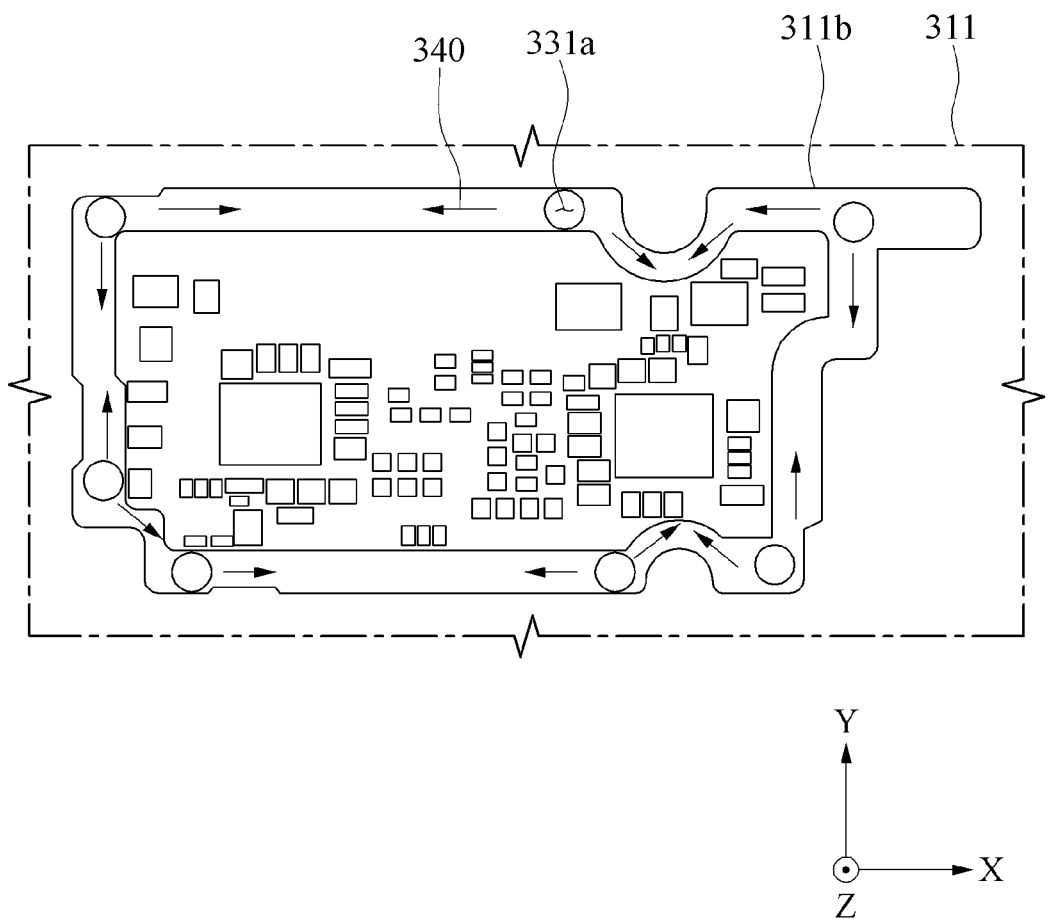
FIG. 3F is a diagram illustrating a filling flow of a filler in the printed circuit board according to an embodiment.

FIG. 3A is a perspective view of a PCB according to an embodiment, FIG. 3B is an enlarged view of area A of FIG. 3A, FIG. 3C is a cross-sectional view along line B-B of FIG. 3B, FIG. 3D is a cross-sectional view of an interposer according to an embodiment, FIG. 3E is a cross-sectional view of the PCB according to an embodiment, and FIG. 3F is a diagram illustrating a filling flow of a filler in the PCB according to an embodiment.

Referring to FIGS. 3A to 3F, a PCB 300 (e.g., the PCBs 251 and 252 of FIG. 2C) may be inside an electronic device (e.g., the electronic device 201 of FIG. 2C). In an embodiment, the PCB 300 may be formed in a multi-layer circuit board structure including one or more circuit boards 310.

In an embodiment, the PCB 300 may include the circuit boards 310 respectively including electrical elements, one or more interposers 320 connecting the circuit boards 310 to one another, one or more through holes 330 formed through the PCB 300, and a filler 340 coating at least some of the surface of the PCB 300.

In an embodiment, the circuit boards 310 may include a first circuit board 311 and a second circuit board 312 that are parallel to each other. In an embodiment, the respective surfaces of the first circuit board 311 and the second circuit board 312 may include one or more electrical elements. For example, the electrical elements may include components, such as an AP, a GPU, and a PMIC, for performing functions in an electronic device.

In an embodiment, the first circuit board 311 may include a first board surface 311a and a second board surface 311b that is opposite to the first board surface 311a. In an embodiment, the second circuit board 312 may include a third board surface 312a and a fourth board surface 312b that is opposite to the third board surface 312a. In an embodiment, the second circuit board 312 may be arranged such that the third board surface 312a thereof may face the second board surface 311b of the first circuit board 311. In an embodiment, the first circuit board 311 and the second circuit board 312 may be practically parallel to each other such that the second board surface 311b and the third board surface 312a may be spaced apart from each other.

In an embodiment, the interposers 320 may be between the circuit boards 310 that are parallel to one another and may connect those circuit boards 310 to one another in a height direction (e.g., the Z-axis direction of FIG. 3A). In an embodiment, the interposers 320 may include one or more via holes 3241 formed through the interposers 320 in a height direction of the PCB 300. In an embodiment, the via holes 3241 may each include a via 324. In an embodiment, the via 324 may electrically connect a pair of adjacent circuit boards 310 connected through the interposer 320 to each other. For example, the via 324 may be electrically connected to an electric circuit or an electrical element on the pair of circuit boards 310 directly or indirectly. In an embodiment, the via 324 may include a conductive material to electrically connect electrical elements on the circuit boards 310. In an embodiment, the via holes 3241 may be connected to the circuit boards 310 by a joining member 323 to be described below.

In an embodiment, the interposers 320 may include a first interposer 321 connecting the first circuit board 311 to the second circuit board 312. For example, the first interposer 321 may connect the second board surface 311b of the first circuit board 311 to the third board surface 312a of the second circuit board 312 in a height direction perpendicular to the second board surface 311b. Hereinafter, for ease of description, the direction (e.g., the Z-axis direction of FIG. 3A) that is perpendicular to the second board surface 311b may be referred to as a height direction.

Figure 5A:
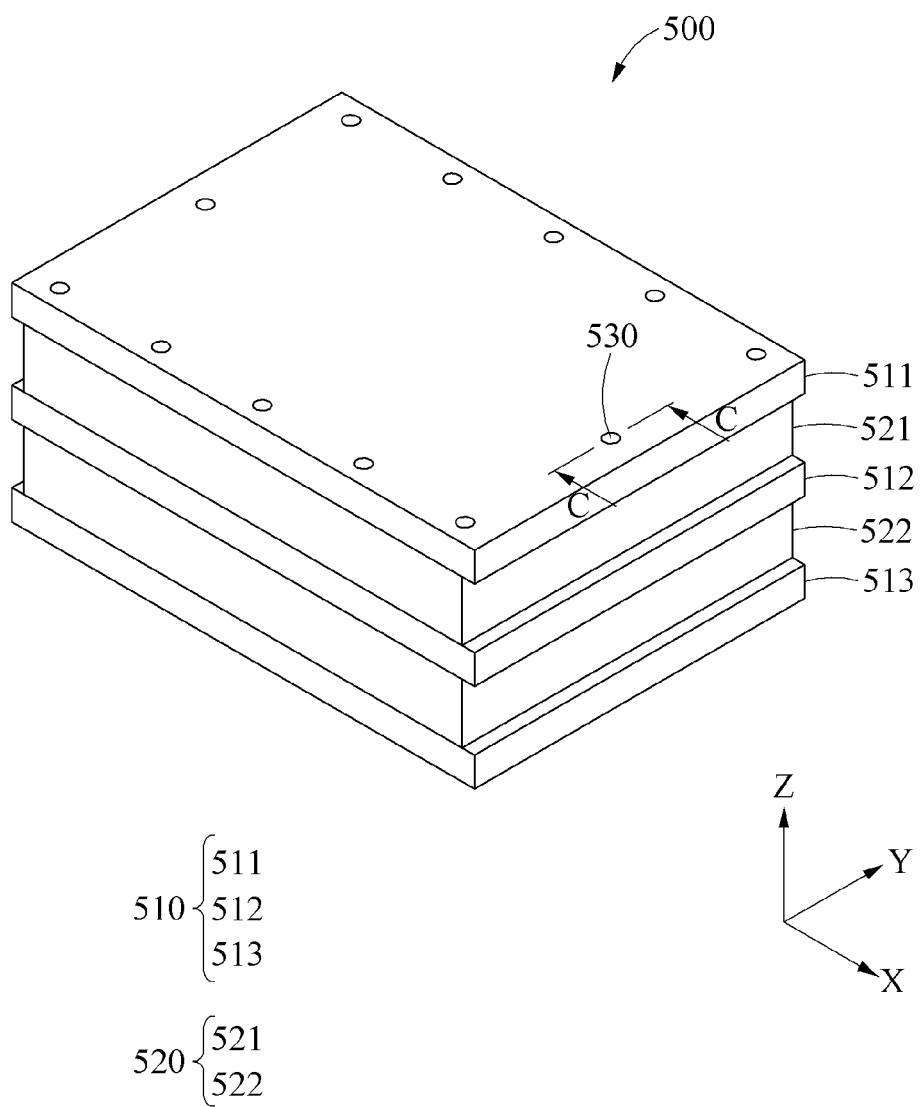
FIG. 5A is a perspective view of the printed circuit board according to an embodiment.

In addition, although the PCB 300 is illustrated as including two circuit boards 310 and one interposer 320 connecting the two circuit boards 310 in FIGS. 3A to 3E, the foregoing example is just for ease of description, and the number of the circuit boards 310 included in the PCB 300 and the number of the interposers 320 included in the PCB 300 are not limited thereto. For example, a PCB (e.g., a PCB 500 of FIG. 5A), as illustrated in FIG. 5A, may include three circuit boards (e.g., circuit boards 510 of FIG. 5A) that are parallel to one another and two interposers (e.g., interposers 520 of FIG. 5A) connecting the circuit boards 510 to one another, and it should be noted that the PCB may also include four or more circuit boards and three or more interposers.

In an embodiment, the first interposer 321 may be at the edge of the first circuit board 311 and the edge of the second circuit board 312. For example, when facing the second board surface 311b of the first circuit board 311, the first interposer 321 may be arranged along at least some of the circumference of the second board surface 311b and may connect the first circuit board 311 and the second circuit board 312. For example, the first interposer 321 may be arranged in a closed-loop form along the respective edges of the first circuit board 311 and the second circuit board 312.

In an embodiment, when the first interposer 321 is at the edge of the first circuit board 311 or the edge of the second circuit board 312, and when facing the first board surface 311a, the edge of the first circuit board 311 or the edge of the second circuit board 312 may not be practically stepped compared to the outer surface of the first interposer 321.

In an embodiment, the first interposer 321 may electrically connect the first circuit board 311 to the second circuit board 312. For example, the first interposer 321 may be connected to the first circuit board 311 and the second circuit board 312 through a plurality of joining members 323. In an embodiment, the joining members 323 may be between the circuit boards 310 and the interposers 320 and may connect the circuit boards 310 to the interposers 320.

For example, the joining members 323 may be arranged on the first interposer 321 in the direction facing the second board surface 311b and the third board surface 312a. In an embodiment, the joining members 323 may be arranged in various forms, and each of the joining members 323 may be in practically the same shape.

In an embodiment, based on the height direction of the PCB 300, a gap 350 may be between the interposer 320 and the circuit board 310. For example, the gap 350 may be formed by the joining member 323 between the circuit board 310 and the interposer 320 that are connected to each other. In an embodiment, a filler 340 in a liquid state, to be described below, may fill the gap 350 between the circuit board 310 and the interposer 320. In an embodiment, a first gap 351 may be between the second board surface 311b of the first circuit board 311 and the first interposer 321, and a second gap 352 may be between the third board surface 312a of the second circuit board 312 and the first interposer 321.

In an embodiment, the through holes 330 may be formed in the height direction through the PCB 300. In an embodiment, when facing the first board surface 311a, the through hole 330 may be in a position where the circuit board 310 overlaps with the interposer 320. For example, the through hole 330 may be formed in the height direction through the portion where the circuit board 310 is connected to the interposer 320. In an embodiment, the lengths of the through holes 330 may be different from one another in the height direction. In an embodiment, the through holes 330 may be formed through at least one of the circuit board 310 and the interposer 320 in the height direction of the PCB 300.

Hereinafter, the description of the through hole 330 formed through the PCB 300 is provided under the assumption that the filler 340 in a liquid state is supplied into the interposer 320 through the first board surface 311a. For example, the first circuit board 311 is illustrated as being on top of the second circuit board 312, and the through hole 330 is illustrated as being formed through the PCB 300 from the first board surface 311a in a −Z-axis direction in FIGS. 3A to 3F to describe that the filler 340 flows in the gravity direction when the filler 340 is supplied to the PCB 300.

In an embodiment, the through hole 330 may include a board through hole 331 that is formed through the circuit board 310 and an interposer through hole 332 that is formed through the interposer 320. In an embodiment, at least some of the board through hole 331 and the interposer through hole 332 forming one through hole 330 may overlap in the height direction such that the board through hole 331 and the interposer through hole 332 may communicate with each other. In an embodiment, the number of the board through holes 331 and the number of the interposer through holes 332 may be one or more.

In an embodiment, at least one of the circuit boards 310 may include the board through hole 331. The board through hole 331 may be formed through the circuit board 310 in the height direction of the PCB 300. In an embodiment, the board through hole 331 may include a first board through hole 331a that is formed through the first circuit board 311 in the height direction and a second board through hole 331b that is formed through the second circuit board 312 in the height direction. In an embodiment, the first board through hole 331a may be formed through the first circuit board 311 in the height direction of the PCB 300 from the first board surface 311a to the second board surface 311b. In an embodiment, the second board through hole 331b may be formed through the second circuit board 312 in the height direction of the PCB 300 from the third board surface 312a to the fourth board surface 312b.

In an embodiment, the interposer through hole 332 may be formed through the interposer 320 in the height direction of the PCB 300. In an embodiment, one or more interposer through holes 332 may be formed through one interposer 320. In an embodiment, the interposer through hole 332 formed through the interposer 320 may communicate with the board through hole 331 of the circuit board 310 adjacent to the interposer through hole 332. For example, when viewed from the height direction of the PCB 300, the interposer through hole 332 may overlap with the board through hole 331 such that the interposer through hole 332 and the board through hole 331 may be formed integrally. In an embodiment, at least one interposer through hole 332 formed through one interposer 320 may not overlap with the board through hole 331 of the circuit board 310 adjacent to the interposer through hole 332. In this case, the interposer through hole 332 and the board through hole 331 that are not overlapping with each other may indirectly communicate with each other through the gap 350 between the circuit board 310 and the interposer 320.

In an embodiment, the interposer through hole 332 may include the first interposer through hole 332a formed through the first interposer 321. In an embodiment, a first interposer through hole 332a may be in a position overlapping or not overlapping the first board through hole 331a and/or the second board through hole 331b, based on the height direction of the PCB 300.

In an embodiment, when viewed from the height direction of the PCB 300, the through hole 330 may have a practically circular or polygonal cross-sectional shape, but the circular or polygonal shape is just an example, and the cross-sectional shape of the through hole 330 is not limited thereto. In other words, the cross-section of the through hole 330 may be formed in various shapes depending on an inflow condition of the filler 340 or a design condition of the PCB 300. In an embodiment, when viewed from the height direction of the PCB 300, and the board through hole 331 overlaps with the interposer through hole 332, the board through hole 331 and the interposer through hole 332 may have practically the same shape (e.g., a circle).

In an embodiment, the filler 340 may be supplied to the PCB 300 in a liquid state and may be applied to at least some of the surface of the PCB 300. In an embodiment, the filler 340 may flow into the inside of the PCB 300 through the through hole 330 formed through the PCB 300. In an embodiment, the filler 340 flowing into the inside (e.g., the inside of the circuit board 310, the inside of the interposer 320, or the gap 350 between the circuit board 310 and the interposer 320) of the PCB 300 through the through hole 330 may fill the gap 350 between the circuit board 310 and the interposer 320. In an embodiment, the filler 340 may include a non-conductive material. In an embodiment, the filler 340 may be supplied to the PCB 300 in a liquid state, may harden with heat or at room temperature after being supplied, and may coat at least some of the surface of the PCB 300. For example, the filler 340 may coat a portion connecting the circuit board 310 to the interposer 320. In an embodiment, the filler 340 may fill and coat the gap 350 between the circuit board 310 and the interposer 320 and may increase the hardness of the PCB 300. In an embodiment, the filler 340 flowing into the inside of the PCB 300 through the through hole 330 may also fill and coat the through hole 330, besides the gap 350 between the circuit board 310 and the interposer 320.

In an embodiment, when the filler 340 is supplied to the inside of the interposer 320 through the through hole 330, the area of the PCB 300 may decrease. For example, because the filler 340 in a liquid state falls in the gravity direction, when the filler 340 is directly applied to the outer surface of the interposer 320, a dummy area of the circuit board 310 protruding to the outside of the interposer 320 may be required to position the filler 340 in a liquid state. In an embodiment, when the through hole 330 for supplying the filler 340 is formed through the PCB 300, the dummy area, for preventing the filler 340 from falling, of the circuit board 310 may be omitted, and the size of the PCB 310 may decrease.

In an embodiment, when the filler 340 is supplied to the PCB 300 in a liquid state, the filler 340 in a liquid state may be supplied to the inside of the interposer 320 through the through hole 330. In an embodiment, the filler 340 may flow into the inside of the PCB 300 through the through hole 330 formed through the PCB 300, for example, through the first board surface 311a. In an embodiment, the filler 340 injected into the inside of the PCB 300 may flow along the height direction of the PCB 300, for example, in the gravity direction (e.g., the −Z-axis direction of FIG. 3C).

In an embodiment, fillers 341 and 342 respectively flowing through the first board through holes 331a-1 and 331a-2 may coat the second board surface 311b by flowing through the first gap 351 between the second board surface 311b and the first interposer 321. In an embodiment, the fillers 341 and 342 respectively flowing through the first board through holes 331a-1 and 331a-2 may flow toward the first interposer through holes 332a-1 and 332a-2. In an embodiment, the fillers 341 and 342 respectively flowing through the first interposer through holes 332a-1 and 332a-2 may flow through the second gap 352 between the first interposer 321 and the third board surface 312a and may coat the third board surface 312a.

In an embodiment, when the first interposer through hole 332a-2 overlaps with the second board through hole 331b, the filler 342 flowing through the first interposer through hole 332a-2 may flow through the second circuit board 312 to the fourth board surface 312b. In this case, the filler 342 may coat the fourth board surface 312b.

In an embodiment, when the first interposer through hole 332a-1 does not overlap with the second board through hole 331b, the filler 341 flowing through the first interposer through hole 332a-1 may flow along the gravity direction (e.g., the −Z-axis direction of FIG. 3D) and concentrate the filling of the filler 341 on the second gap 352. In an embodiment, when the first board through hole 331a-2, the first interposer through hole 332a-2, and the second board through hole 331b overlap with one another, the through hole 330 may be formed through the first circuit board 311, the first interposer 321, and the second circuit board 312. Therefore, the through hole 330 may be used to supply the filler 342 after arranging the second circuit board 312 to be on top of the first circuit board 311 in the gravity direction, contrary to the case when the first interposer through hole 332a-1 does not overlap with the second board through hole 331b. In this case, the filler 342 supplied through the second board through hole 331b from the fourth board surface 312b may flow toward the first circuit board 311 in the gravity direction and may flow to the first gap 351 between the second board surface 311b and the first interposer 321. Accordingly, the filler 340 may be evenly applied between the first and second circuit boards 311 and 312 and the first interposer 321.

Hereinafter, the filling flow of the filler 340 is described with reference to FIG. 3F. Although the first circuit board 311 and the first board through hole 331a are mainly illustrated in FIG. 3F for ease of description, this is just an example, and the filling flow of the circuit board 310, through which the through hole 330 is formed, may also be substantially the same as the following description.

Referring to FIG. 3F, the filler 340 flowing through the first board through hole 331 formed through the first circuit board 311 may flow through the first gap 351 between the first circuit board 311 and the first interposer 321 and may flow to the second board surface 311b. In an embodiment, the number of the first board through holes 331 may be plural. In an embodiment, the filler 340 may flow in both directions along the circumference of the first circuit board 311, based on one first board through hole 331a. In an embodiment, at least some of the flowing paths of the filler 340 flowing through a plurality of first board through holes 311 may overlap. In an embodiment, with the at least some of the flowing paths of the filler 340 overlapping, the filler 340 may be evenly applied along the edge of the first circuit board 311.

Figure 4A:
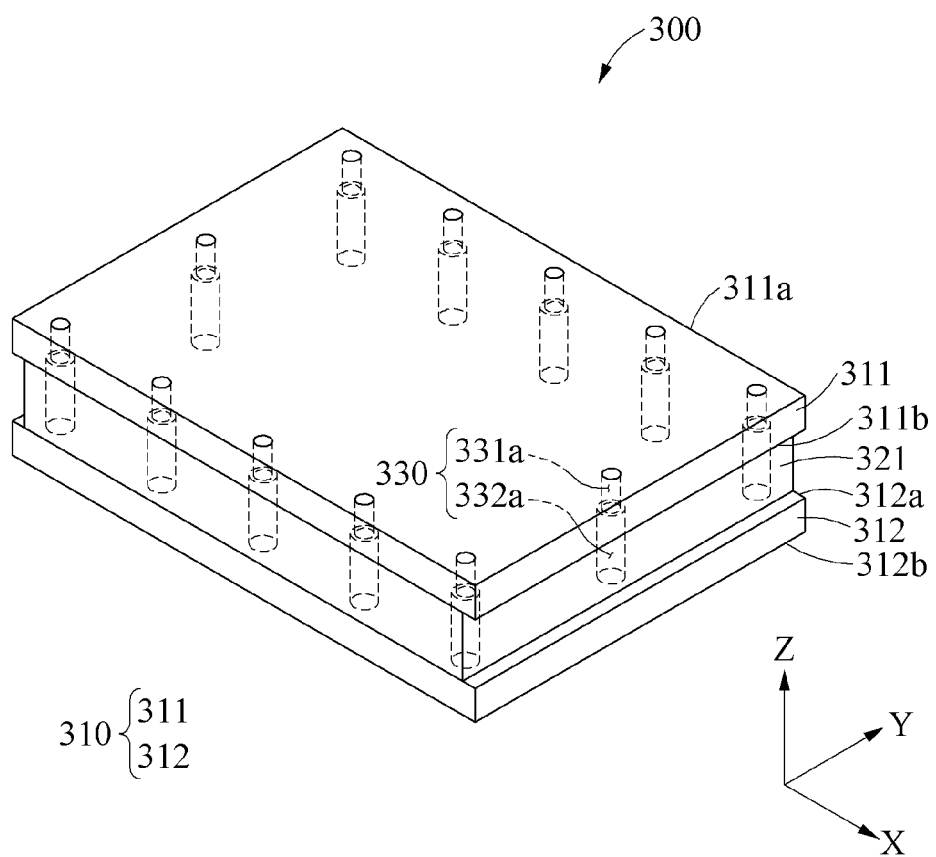
FIGS. 4A and 4B are diagrams illustrating the shapes of through holes having different cross-sectional areas according to an embodiment.
Figure 4B:
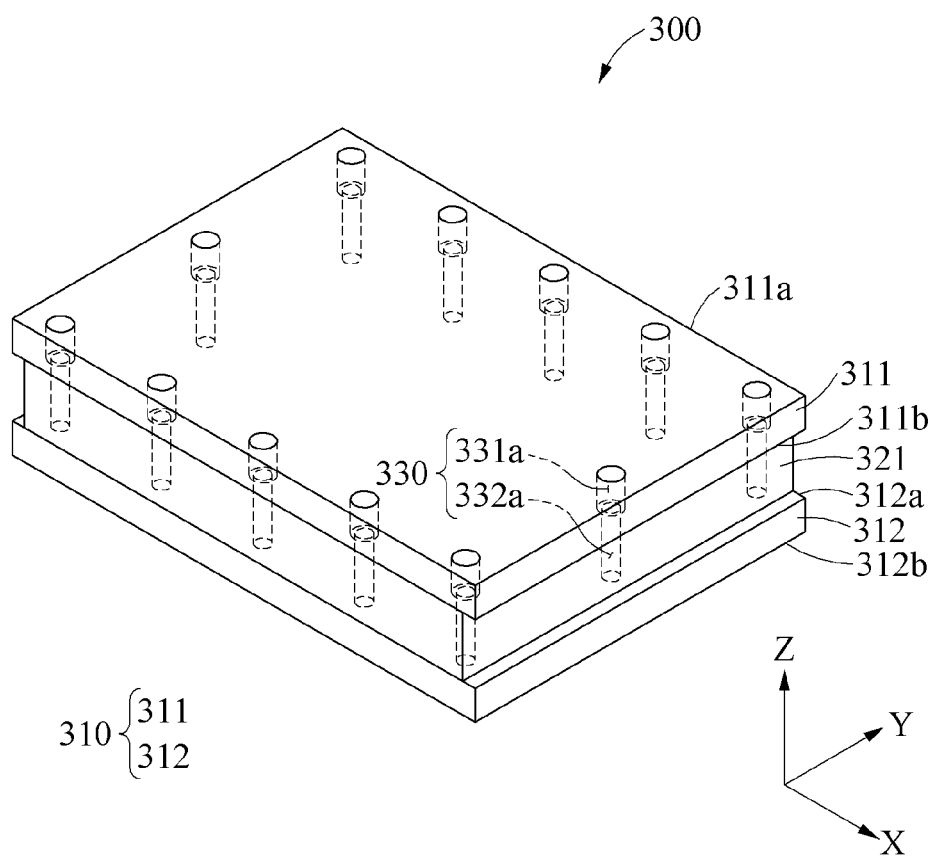

FIGS. 4A and 4B are diagrams illustrating the shapes of through holes having different cross-sectional areas according to an embodiment.

Referring to FIGS. 4A and 4B, the through hole 330 may include the first board through hole 331a formed through the first board surface 311a and the first interposer through hole 332a formed through the first interposer 321. In an embodiment, the first board through hole 331a may be formed from the surface of the first circuit board 311, for example, the first board surface 311a, and may extend from the first board surface 311a to the second board surface 311b in the height direction (e.g., the −Z-axis direction of FIG. 4A) of the PCB 300. In an embodiment, the first interposer through hole 332a may be formed through an interposer (e.g., the interposer 320 of FIG. 3A), for example, the upper surface of the first interposer 321 between the first circuit board 311 and the second circuit board 312, and extend from the upper surface to the third board surface 312a in the height direction. In an embodiment, the first board through hole 331a may communicate with the first interposer through hole 332a in the height direction. In an embodiment, when viewed from the height direction of the PCB 300, the cross-sectional area of the first board through hole 331a may be different from the cross-sectional area of the first interposer through hole 332a. For example, the cross-sectional area of the first board through hole 331a may be greater or less than the cross-sectional area of the first interposer through hole 332a. In an embodiment, the cross-sectional area of the first board through hole 331a and the cross-sectional area of the first interposer through hole 332a may vary depending on the respective design conditions of the circuit board 310 and the interposer 320 and the inflow condition of the filler 340. In an embodiment, when facing the first board surface 311a, an arrangement distance (e.g., the arrangement distance on the XY plane of FIG. 4A) of the first board through hole 331a and the first interposer through hole 332a may vary depending on the respective design conditions of the circuit board 310 and the interposer 320 and the inflow condition of the filler 340.

Hereinafter, a PCB according to an embodiment is described. The descriptions of the embodiments above may be equally applied to the embodiments below unless otherwise described.

Figure 5B:
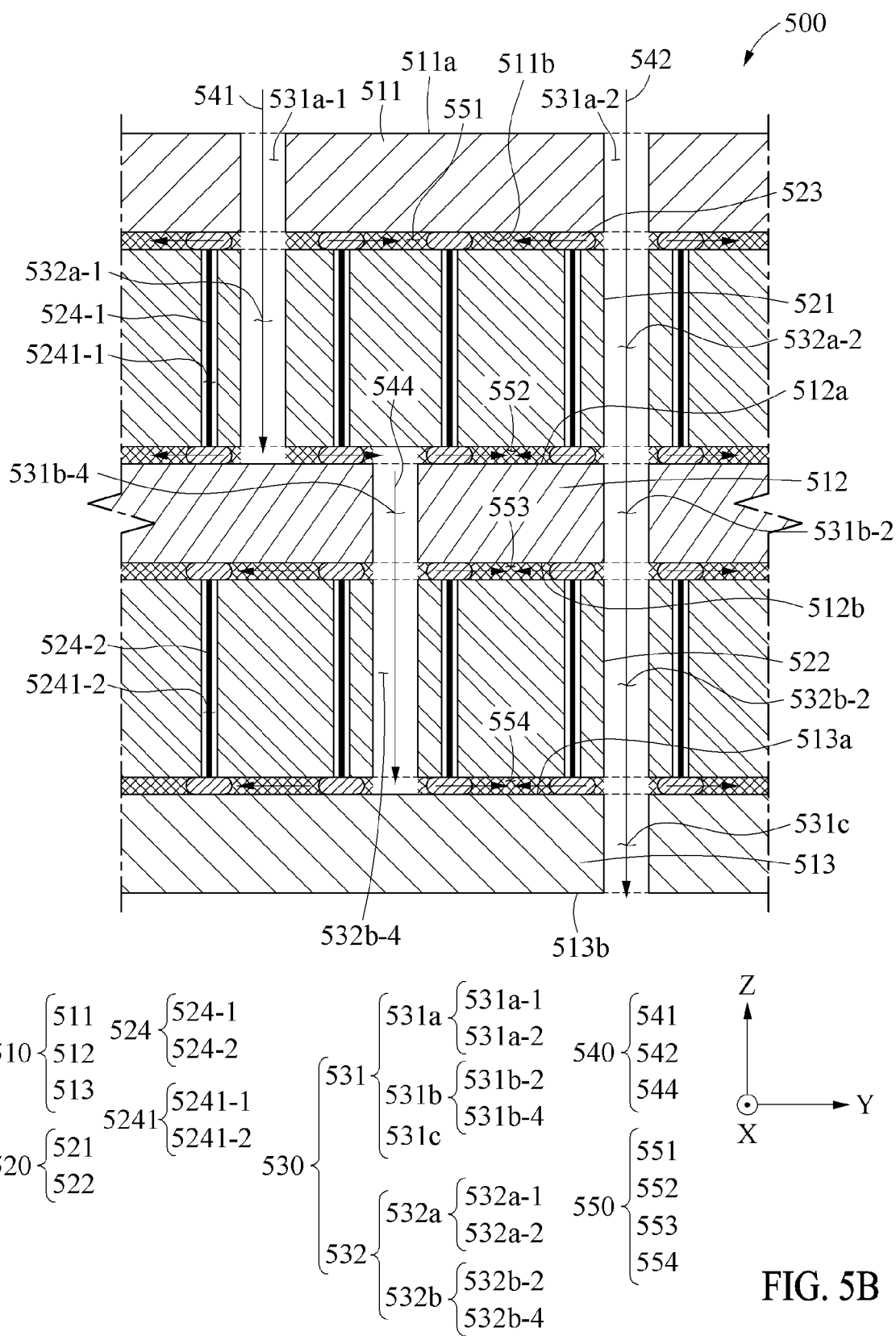
FIGS. 5B and 5C are cross-sectional views along line C-C of FIG. 5A, according to an embodiment.
Figure 5C:
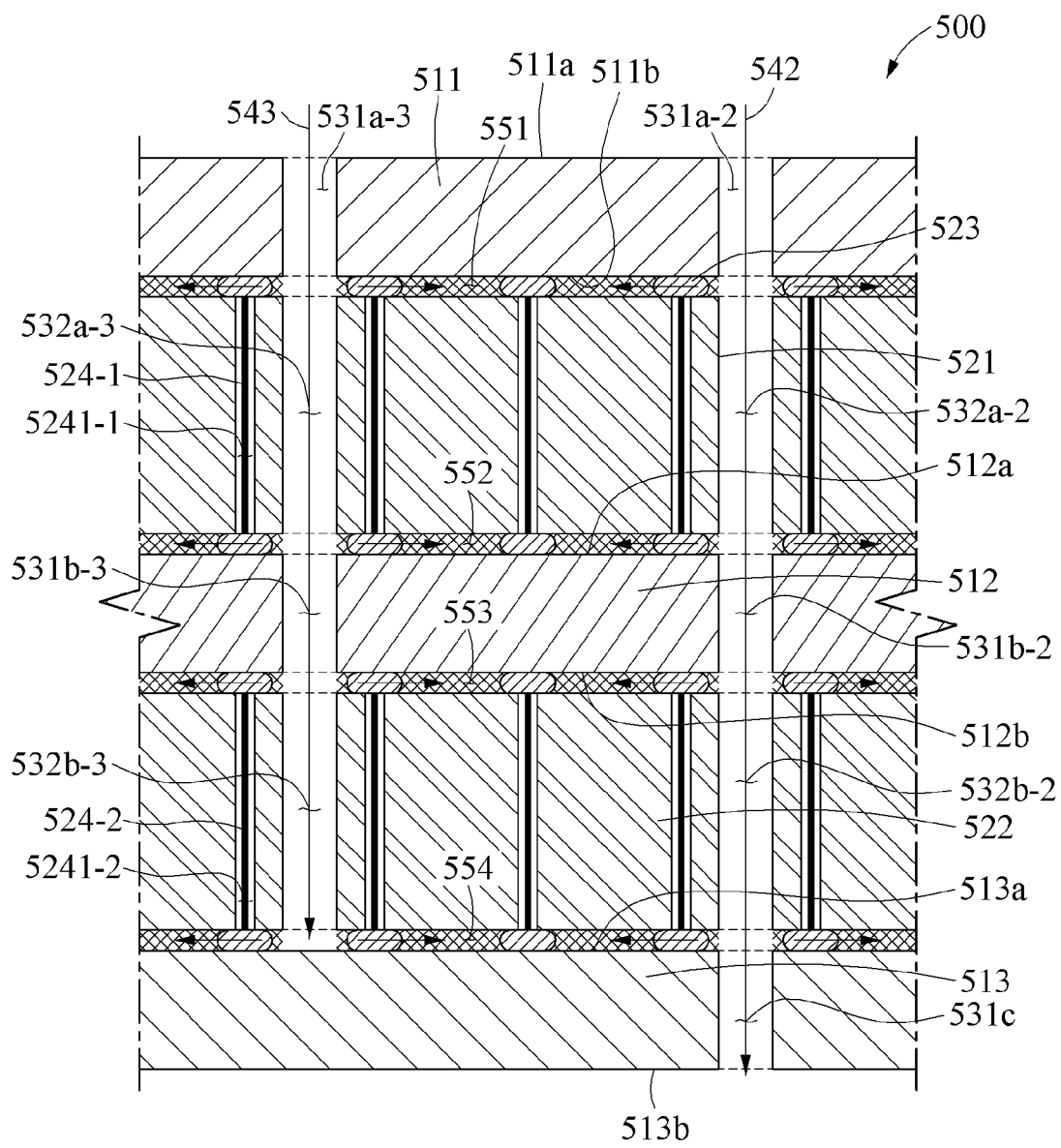

FIG. 5A is a perspective view of the printed circuit board according to an embodiment, and FIGS. 5B and 5C are cross-sectional views along line C-C of FIG. 5A, according to an embodiment.

Referring to FIGS. 5A to 5C, a PCB 500 may include a plurality of circuit boards 510 that are parallel to one another, a plurality of interposers 520 electrically connecting the circuit boards 510 to one another, a through hole 530 formed through the circuit boards 510 and the interposers 520, and a filler 540 coating at least some of the surface of the PCB 500.

In an embodiment, the circuit boards 510 may include a first circuit board 511, a second circuit board 512, and a third circuit board 513 that are parallel to one another. In an embodiment, the first circuit board 511 may include a first board surface 511a and a second board surface 511b that is opposite to the first board surface 511a. In an embodiment, the second circuit board 512 may include a third board surface 512a that is practically parallel to the first circuit board 511 and a fourth board surface 512b that is opposite to the third board surface 512a. In an embodiment, the third circuit board 513 may include a fifth board surface 513a that is practically parallel to the first circuit board 511 with the second circuit board 512 being between the first circuit board 511 and the fifth board surface 513a and a sixth board surface 513b that is opposite to the fifth board surface 513a. In an embodiment, the third circuit board 513 may be arranged such that the fifth board surface 513a thereof may face the fourth board surface 512b of the second circuit board 512. In an embodiment, the second circuit board 512 and the third circuit board 513 may be practically parallel to each other such that the fourth board surface 512b and the fifth board surface 513a may be spaced apart from each other.

In an embodiment, the interposers 520 may be between the circuit boards 510 that are parallel to one another and may connect those circuit boards 510 to one another in the height direction (e.g., the Z-axis direction of FIG. 5A) of the PCB 500. In an embodiment, the interposers 520 may include a via hole 5241 formed through the interposers 520 in the height direction of the PCB 500. In an embodiment, the via hole 5241 may include a via 524 for electrically connecting the circuit boards 510 that are parallel to one another. In an embodiment, the via 524 may include a conductive material to electrically connect electrical elements on the circuit boards 510. In an embodiment, the via hole 5241 may be connected to the circuit boards 510 by a joining member 523.

In an embodiment, the interposers 520 may include a first interposer 521 and a second interposer 522, in which the first interposer 521 is between the first circuit board 511 and the second circuit board 512 and electrically connects the first circuit board 511 to the second circuit board 512, and the second interposer 522 is between the second circuit board 512 and the third circuit board 513 and electrically connects the second circuit board 512 to the third circuit board 513. For example, the first interposer 521 may connect the second board surface 511b of the first circuit board 511 to the third board surface 512a of the second circuit board 512 in a height direction perpendicular to a board surface, and the second interposer 522 may connect the fourth board surface 512b of the second circuit board 512 to the fifth board surface 513a of the third circuit board 513 in the height direction. In an embodiment, when facing the first board surface 511a, the first interposer 521 may be at the edge of the first circuit board 511 and the edge of the second circuit board 512, and the second interposer 522 may be at the edge of the second circuit board 512 and the edge of the third circuit board 513. In an embodiment, the first interposer 521 and the second interposer 522 may overlap or may not overlap with each other or with the first circuit board 511 to the third circuit board 513, based on a direction (e.g., the Z-axis direction of FIG. 5A) perpendicular to the first board surface 511a. In an embodiment, the first interposer 521 and the second interposer 522 may connect a pair of circuit boards 510 adjacent to each other and may have various arrangement forms depending on design conditions. For example, at least some of the circumference of the interposer 520 may protrude from the inside to the outside of the circumference of the circuit board 510.

In an embodiment, one or more via holes 5241 may be formed through the first interposer 521 and the second interposer 522 in the height direction of the PCB 500. In an embodiment, the via holes 5241 may each include a via 524. In an embodiment, the via 524 may electrically connect a pair of adjacent circuit boards 510 connected through the interposer 520 to each other. For example, the via 524-1 in the via hole 5241-1 formed through the first interposer 521 may electrically connect the first circuit board 511 to the second circuit board 512. The via 524-2 in the via hole 5241-2 formed through the second interposer 522 may electrically connect the second circuit board 512 to the third circuit board 513. In an embodiment, the via hole 5241 may be connected to the circuit board 510 by the joining member 523 to be described below.

In an embodiment, the interposer 520 may include a plurality of joining members 523 for electrically connecting a plurality of circuit boards 510 adjacent to one another. In an embodiment, the joining members 523 may be between the circuit boards 510 and the interposers 520 to be in contact with the board surface and may connect the circuit boards 510 to the interposers 520.

In an embodiment, based on the height direction of the PCB 500, a gap 550 may be between the interposer 520 and the circuit board 510. For example, the interposer 520 and the circuit board 510 may be spaced apart from each other at a certain distance by the joining members 523 and may form the gap 550 between the interposer 520 and the circuit board 510. In an embodiment, a first gap 551 may be between the second board surface 511b of the first circuit board 511 and the first interposer 521, a second gap 552 may be between the third board surface 512a of the second circuit board 512 and the first interposer 521, a third gap 553 may be between the fourth board surface 512b of the second circuit board 512 and the second interposer 522, and a fourth gap 554 may be between the fifth board surface 513a of the third circuit board 513 and the second interposer 522.

Hereinafter, when describing the through hole 530 formed through the PCB 500, the first circuit board 511 is illustrated as being on top of the second circuit board 512, the second circuit board 512 is illustrated as being on top of the third circuit board 513, and the through hole 530 is illustrated as being formed through the PCB 500 in the −Z-axis direction to describe that the filler 540 flows in the gravity direction while being supplied to the PCB 500.

In an embodiment, the through hole 530 may include a board through hole 531 that is formed through the circuit board 510 and an interposer through hole 532 that is formed through the interposer 520. In an embodiment, the number of the board through holes 531 and the number of the interposer through holes 532 may be one or more.

In an embodiment, when viewed from the height direction of the PCB 500, the board through hole 531 may include a first board through hole 531a, a second board through hole 531b, and a third board through hole 531c, in which the first board through hole 531a is formed through the first circuit board 511 from the first board surface 511a to the second board surface 511b, the second board through hole 531b is formed through the second circuit board 512 from the third board surface 512a to the fourth board surface 512b, and the third board through hole 531c is formed through the third circuit board 513 from the fifth board surface 513a to the sixth board surface 513b. In an embodiment, the respective numbers of first board through holes 531a, second board through holes 531b, and third board through holes 531c may be one or more.

In an embodiment, the interposer through hole 532 may communicate with the board through hole 531. For example, when viewed from the height direction of the PCB 500, the interposer through hole 532 may overlap with the board through hole 531. In an embodiment, the interposer through hole 532 may indirectly communicate with the board through hole 531 through the gap 550 between the circuit board 510 and the interposer 520 when the interposer through hole 532 does not overlap with the board through hole 531.

In an embodiment, the interposer through hole 532 may include a first interposer through hole 532a formed through the first interposer 521 and a second interposer through hole 532b formed through the second interposer 522, based on the height direction of the PCB 500. In an embodiment, the first interposer through hole 532a may be in a position overlapping or not overlapping the first board through hole 531a and/or the second board through hole 531b, based on the height direction of the PCB 500. In an embodiment, the second interposer through hole 532b may be in a position overlapping or not overlapping the second board through hole 531b and/or the third board through hole 531c, based on the height direction of the PCB 500. In an embodiment, the second interposer through hole 532b may be in a position overlapping or not overlapping the first interposer through hole 532a, based on the height direction of the PCB 500.

In an embodiment, the filler 540 in a liquid state may fill the gap 550 between the circuit board 510 and the interposer 520. In an embodiment, the filler 540 may be supplied to the PCB 500 in a liquid state and may coat at least some of the surface of the PCB 500. For example, the filler 540 may coat a portion connecting the PCB 500 to the interposer 520. In an embodiment, the filler 540 may flow into the inside of the PCB 500 through the through hole 530.

In an embodiment, fillers 541, 542, and 543 respectively flowing through first board through holes 531a-1, 531a-2, and 531a-3 may coat the second board surface 511b by flowing through the first gap 551 between the second board surface 511b and the first interposer 521. In an embodiment, the fillers 541, 542, and 543 respectively flowing through the first board through holes 531a-1, 531a-2, and 531a-3 may flow toward the first interposer through holes 532a-1, 532a-2, and 532a-3. In an embodiment, the fillers 541, 542, and 543 respectively flowing through the first interposer through holes 531a-1, 531a-2, and 531a-3 may flow through the second gap 552 between the first interposer 521 and the third board surface 512a and may coat the third board surface 512a.

Referring to FIG. 5B, when the first interposer through hole 532a-1 does not overlap with a second board through hole 531b-4, a filler 544 flowing through the second gap 552 may flow through the third gap 553 and the fourth gap 554 while flowing in the gravity direction and may coat the fourth board surface 512b and the fifth board surface 513a. In this case, the filling of the filler 544 may be concentrated on the fourth gap 554 while the filler 544 flows in the gravity direction (e.g., the −Z-axis direction of FIG. 5B).

Referring to FIG. 5C, when the first interposer through hole 532a-3 overlaps with a second board through hole 531b-3, the filler 543 flowing through the first interposer through hole 532a-3 may flow through the second circuit board 512. In an embodiment, the filler 543 flowing through a second board through hole 531b-3 may coat the fourth board surface 512b and the fifth board surface 513a through the third gap 553 and the fourth gap 554 while the filler 543 flows in the gravity direction. In this case, the filling of the filler 543 may be concentrated on the fourth gap 554 while the filler 543 flows in the gravity direction (e.g., the −Z-axis direction of FIG. 5C).

Referring to FIGS. 5B and 5C, when the first board through hole 531a-2, the first interposer through hole 532a-2, a second board through hole 531b-2, a second interposer through hole 532b-2, and the third board through hole 531c overlap with one another, the filler flowing through the first board through hole 531a-2 may flow in the gravity direction, may flow through the first gap 551, the second gap 552, the third gap 553, and the fourth gap 554, and coat the second board surface 511b, the third board surface 512a, the fourth board surface 512b, and the fifth board surface 513a. In an embodiment, the filler 542 flowing through the second interposer through hole 532b-2 may flow through the third circuit board 513 and may coat the sixth board surface 513b.

According to an embodiment, the electronic device 201 may include the housing 210 including the front surface 210a, the rear surface 210b that is opposite to the front surface 210a, and the side surface 210c enclosing the inner space between the front surface 210a and the rear surface 210b, the display 261 that is visually exposed to the outside of the electronic device 201, and the printed circuit board 300 or 500 that is in the inner space. In an embodiment, the printed circuit board 300 or 500 may include the plurality of circuit boards 310 or 510 that are parallel to one another and each include electrical elements and the one or more interposers 320 or 520 that are between the plurality of circuit boards 310 or 510 and connecting the pair of circuit boards 310 or 510 adjacent to each other in the height direction. In an embodiment, the gap 350 or 550 may be between the pair of circuit boards 310 or 510 adjacent to each other and the one or more interposers 320 or 520. In an embodiment, the one or more board through holes 331 or 531 may be formed in the height direction through at least one of the plurality of circuit boards 310 or 510. In an embodiment, the one or more interposers 320 or 520 may include the one or more via holes 3241 or 5241 that are formed in the height direction through the one or more interposers 320 or 520, the via 324 or 524 that is in the one or more via holes 3241 or 5241 and electrically connecting the pair of circuit boards 310 or 510 adjacent to each other, and the one or more interposer through holes 331 or 531 that are formed in the height direction through the one or more interposers 320 or 520 and respectively communicating with the one or more board through holes 331 or 531 of the pair of circuit boards 310 or 510 adjacent to each other. In an embodiment, the non-conductive filler 340 or 540 may be used in the gap 350 or 550 between the one or more interposers 320 or 520 and the pair of circuit boards 310 or 510 adjacent to each other through the one or more board through holes 331 or 531 and the one or more interposer through holes 332 or 432.

In an embodiment, the plurality of circuit boards 310 or 510 may include the first circuit board 311 or 511 including the first board surface 311a or 511a and the second board surface 311b or 511b that is opposite to the first board surface 311a or 511a and the second circuit board 312 or 512 including the third board surface 312a or 512b that is practically parallel to the first circuit board 311 or 511 and facing the second board surface 311b or 511b and the fourth board surface 312b or 512b that is opposite to the third board surface 312a or 512a, and the one or more interposers 320 or 520 may include the first interposer 321 or 521 that is between the first circuit board 311 or 511 and the second circuit board 312 or 512, in which the first circuit board 311 or 511 includes the first board through hole 331a or 531a, and the first interposer 321 or 521 includes the first interposer through hole 332a or 532a communicating with the first board through hole 331a or 531a.

In an embodiment, the second circuit board 312 or 512 may include the second board through hole 331b or 531b communicating with the first interposer through hole 332a or 532a.

In an embodiment, the cross-sectional area of the board through hole 331 or 531 may be different from the cross-sectional area of the interposer through hole 332 or 532 when viewed from the height direction.

In an embodiment, the filler 340 or 540 may be supplied to the board through hole 331 or 531 and the interposer through hole 332 or 532 in a liquid state and may flow through the gap 350 or 550 between the one or more interposers 320 or 520 and the pair of circuit boards 310 or 510 adjacent to each other to the surface of the plurality of circuit boards 310 or 510.

In an embodiment, the plurality of circuit boards 310 or 510 may further include the first circuit board 511 including the first board surface 511a and the second board surface 511b that is opposite to the first board surface 511a, the second circuit board 512 including the third board surface 512a that is practically parallel to the first circuit board 511 and facing the second board surface 511b and the fourth board surface 512b that is opposite to the third board surface 512a, and the third circuit board 513 including the fifth board surface 513a that is practically parallel to the first circuit board 511 with the second circuit board 512 being between the first circuit board 511 and the fifth board surface 513a and facing the fourth board surface 512b and the sixth board surface 513b that is opposite to the fifth board surface 513a, and the one or more interposers 520 may include the first interposer 521 that is between the first circuit board 511 and the second circuit board 512 and a second interposer 522 that is between the second circuit board 512 and the third circuit board 513.

In an embodiment, the first board through hole 531a may be formed through the first circuit board 511 from the first board surface 511a to the second board surface 511b, the second board through hole 531b may be formed through the second circuit board 512 from the third board surface 512a to the fourth board surface 512b, the first interposer through hole 532a may be formed through the first interposer 521 in the height direction and may communicate with the first board through hole 531a and the second board through hole 531b, and the second interposer through hole 532b may be formed through the second interposer 522 in the height direction and may communicate with the second board through hole 531b.

In an embodiment, the first interposer through hole 532a may communicate with the second interposer through hole 531b through the gap 552 between the first interposer 521 and the second circuit board 512.

In an embodiment, the second interposer through hole 532b may be in a position not overlapping with the first interposer through hole 532a when viewed from the height direction.

In an embodiment, the third board through hole 531c may be formed through the third circuit board 513 from the fifth board surface 513a and the sixth board surface 513b and may communicate with the second interposer through hole 532b.

In an embodiment, the second interposer through hole 532b may be in a position not overlapping with the third board through hole 531c when viewed from the height direction.

In an embodiment, the cross-sectional shape of the board through hole 331 or 531 and the cross-sectional shape of the interposer through hole 332 or 532 may be practically in a circular form or a polygonal form when viewed from the height direction.

In an embodiment, the board through hole 331 or 531 and the interposer through hole 332 or 532 that are overlapping with each other may include practically the same shape when viewed from the height direction.

In an embodiment, when viewed from the height direction, the interposer 320 or 520 may be at the edge of the circuit board 310 or 510, and the filler 340 or 540 supplied through the board through hole 331 or 531 and the interposer through hole 332 or 532 may flow in the circumferential direction of the circuit board 310 or 510 through the gap 350 or 550 between the one or more interposers 320 or 520 and the pair of circuit boards 310 or 510.

In an embodiment, when viewed from the height direction, the edge of the circuit board 310 or 510 and the edge of the interposer 320 or 520 may not be practically stepped.

According to an embodiment, the printed circuit board 300 or 500 may include the first circuit board 311 or 511 including the first board surface 311a or 511a and the second board surface 311b or 511b that is opposite to the first board surface 311a or 511a, the second circuit board 312 or 512 including the third board surface 312a or 512b that is practically parallel to the first circuit board 311 or 511 and facing the second board surface 311b or 511b and a fourth board surface 312b or 512b that is opposite to the third board surface 312a or 512a, and the first interposer 321 or 521 that is between the first circuit board 311 or 511 and the second circuit board 312 or 512 and connecting the first circuit board 311 or 511 to the second circuit board 312 or 512 in the height direction that is perpendicular to the first board surface 311a or 511a. In an embodiment, the gap 350 or 550, through which the non-conductive filler 340 or 540 flows, may be between the first interposer 321 or 521 and the first circuit board 311 or 511 and between the first interposer 321 or 521 and the second circuit board 312 or 512. In an embodiment, the one or more board through holes 331 or 531 may be formed through at least one of the first circuit board 311 or 511 and the second circuit board 312 or 512 in the height direction. In an embodiment, the first interposer 321 or 521 may include the one or more via holes 3241 or 5241 that are formed in the height direction through the first interposer 321 or 521, the via 324 or 524 that is in the one or more via holes 3241 or 5241 and electrically connecting the first circuit board 311 or 511 to the second circuit board 312 or 512, and the one or more first interposer through holes 332a or 532a that are formed in the height direction through the first interposer 321 or 521 and respectively communicating with the one or more board through holes 331 or 531. In an embodiment, the non-conductive filler 340 or 540 may be used in the gap 350 or 550 between the first interposer 321 or 521 and the first circuit board 311 or 511 and between the first interposer 321 or 521 and the second circuit board 312 or 512 through the board through holes 331 or 531 and the first interposer through holes 332a or 532a.

In an embodiment, the board through hole 331 or 531 may include at least one of the first board through hole 331a or 531a that is formed through the first circuit board 311 or 511 from the first board surface 311a or 511a to the second board surface 311b or 511b in the height direction and the second board through hole 331b or 531b that is formed through the second circuit board 312 or 512 from the third board surface 312a or 512a to the fourth board surface 312b or 512b, in which at least one of the first board through hole 331a or 531a and the second board through hole 331b or 531b communicates with the first interposer through hole 332a or 532a.

According to an embodiment, the printed circuit board 500 may include the first circuit board 511 including the first board surface 511a and the second board surface 511b that is opposite to the first board surface 511a, the second circuit board 512 including the third board surface 512a that is practically parallel to the first circuit board 511 and facing the second board surface 511b and the fourth board surface 512b that is opposite to the third board surface 512a, the third circuit board 513 including the fifth board surface 513a that is practically parallel to the first circuit board 511 with the second circuit board 512 being between the first circuit board 511 and the fifth board surface 513a and facing the fourth board surface 512b and the sixth board surface 513b that is opposite to the fifth board surface 513a, the first interposer 521 that is between the first circuit board 511 and the second circuit board 512 and connecting the first circuit board 511 to the second circuit board 512 in the height direction that is perpendicular to the first board surface 511a, and the second interposer 522 that is between the second circuit board 512 and the third circuit board 513 and connecting the second circuit board 512 to the third circuit board 513 in the height direction that is perpendicular to the third board surface 512a. In an embodiment, the gap 550, through which the non-conductive filler 540 flows, may be between the first interposer 521 and the first circuit board 511, between the first interposer 521 and the second circuit board 512, between the second interposer 522 and the second circuit board 512, and between the second interposer 522 and the third circuit board 513. In an embodiment, the one or more board through holes 531 may be formed through at least one of the first circuit board 511, the second circuit board 512, and the third circuit board 513 in the height direction. In an embodiment, the first interposer 521 and the second interposer 522 may include the one or more via holes 5241 formed through the first interposer 521 and the second interposer 522 in the height direction, the via 524 that is in the one or more via holes 5241 and electrically connecting the first circuit board 511 to the second circuit board 512 and the second circuit board 512 to the third circuit board 513, and the one or more interposer through holes 532 formed through the first interposer 521 and the second interposer 522 in the height direction and respectively communicating with the one or more board through holes 531. In an embodiment, the non-conductive filler 540 may be used in the gap 550 through the board through holes 531 and the interposer through holes 532.

In an embodiment, the board through hole 531 may include at least one of the first board through hole 531a that is formed through the first circuit board 511 from the first board surface 511a to the second board surface 511b in the height direction, the second board through hole 531b that is formed through the second circuit board 512 from the third board surface 512a to the fourth board surface 512b in the height direction and the third board through hole 531c that is formed through the third circuit board 513 from the fifth board surface 513a to the sixth board surface 513b, in which at least one of the first board through hole 531a, the second board through hole 531b, and the third board through hole 531c communicates with the interposer through hole 532.

In an embodiment, the interposer through hole 532 may include at least one of the first interposer through hole 532a that is formed through the first interposer 521 in the height direction and the second interposer through hole 532b that is formed through the second interposer 522 in the height direction, in which the second interposer through hole 532b is in a position not overlapping with the first interposer through hole 532a when viewed from the height direction.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B or C", "at least one of A, B and C", and "at least one of A, B, or C", may include any one of, or all possible combinations of, the items enumerated together in a corresponding one of the phrases. As used herein, such terms as "$1^{st}$" and "$2^{nd}$," or "first" and "second" may be used to simply distinguish a corresponding component from another, and does not limit the components in other aspect (e.g., importance or order). It is to be understood that if a component (e.g., a first component) is referred to, with or without the term "operatively" or "communicatively", as "coupled with", "coupled to", "connected with", or "connected to" another component (e.g., a second component), it means that the component may be coupled with the other component directly (e.g., by wire), wirelessly, or via a third component.

As used in connection with embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to embodiments of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to embodiments, each component (e.g., a module or a program) of the above-described components may include a single entity or multiple entities, and some of the multiple entities may be separately disposed in different components. According to embodiments, one or more of the above-described components or operations may be omitted, or one or more other components or operations may be added. Alternatively or additionally, a plurality of components (e.g., modules or programs) may be integrated into a single component. In such a case, according to embodiments, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
    a housing comprising a front surface, a rear surface that is opposite to the front surface, and a side surface enclosing an inner space between the front surface and the rear surface; and
    a printed circuit board disposed within the inner space, wherein the printed circuit board comprises:
        a plurality of circuit boards that are substantially parallel to one another and comprise one or more electrical elements; and
        one or more interposers disposed between the plurality of circuit boards and connecting a pair of circuit boards, among the plurality of circuit boards, adjacent to each other in a height direction,
    wherein the pair of circuit boards are separated from the one or more interposers by a gap, and one or more board through holes are formed in the height direction through at least one of the plurality of circuit boards,
    wherein the one or more interposers comprise:
        one or more via holes formed in the height direction through the one or more interposers;
        a via disposed within the one or more via holes and configured to electrically connect the pair of circuit boards; and
        one or more interposer through holes formed in the height direction through the one or more interposers and configured to respectively communicate with the one or more board through holes of the pair of circuit boards, and
    wherein the printed circuit board further comprises a non-conductive filler disposed within the gap.

2. The electronic device of claim 1,
    wherein the plurality of circuit boards further comprise:
        a first circuit board comprising a first board surface and a second board surface that is on a side of the first circuit board opposite to the first board surface; and
        a second circuit board comprising a third board surface that is substantially parallel to the first circuit board and faces the second board surface and a fourth board surface that is on a side of the second circuit board opposite to the third board surface,
    wherein the one or more interposers further comprise a first interposer disposed between the first circuit board and the second circuit board, and
    wherein the first circuit board further comprises a first board through hole from among the one or more board through holes, the first interposer comprises a first interposer through hole from among the one or more interposer through holes, and the first interposer through hole is in communication with the first board through hole.

3. The electronic device of claim 2,
    wherein the second circuit board further comprises a second board through hole from among the one or more board through holes, and the second board through hole is in communication with the first interposer through hole.

4. The electronic device of claim 1, wherein
    a cross-sectional area of the one or more board through holes is different from a cross-sectional area of the one or more interposer through holes when viewed from the height direction.

5. The electronic device of claim 1,
    wherein the printed circuit board is configured to receive the non-conductive filler through the one or more board through holes and the one or more interposer through holes in a liquid state and to allow the liquid non-conductive filler to flow through the gap.

6. The electronic device of claim 1,
    wherein the plurality of circuit boards further comprise:
        a first circuit board comprising a first board surface and a second board surface that is on a side of the first circuit board opposite to the first board surface;
        a second circuit board comprising a third board surface that is substantially parallel to the first circuit board and faces the second board surface and a fourth board surface that is on a side of the second circuit board opposite to the third board surface; and
        a third circuit board comprising a fifth board surface that is substantially parallel to the first circuit board and faces the fourth board surface and a sixth board surface that is on a side of the third circuit board opposite to the fifth board surface, wherein the second circuit board is disposed between the first circuit board and the third circuit board, and
    wherein the one or more interposers further comprise:
        a first interposer disposed between the first circuit board and the second circuit board; and
        a second interposer disposed between the second circuit board and the third circuit board.

7. The electronic device of claim 6,
    wherein the first circuit board further comprises a first board through hole from among the one or more board through holes, and the first interposer comprises a first interposer through hole from among the one or more interposer through holes,
    wherein the second circuit board further comprises a second board through hole from among the one or more board through holes, and the second interposer comprises a second interposer through hole from among the one or more interposer through holes,
    wherein the first board through hole is formed through the first circuit board from the first board surface to the second board surface, and the second board through hole is formed through the second circuit board from the first board surface to the second board surface,
    wherein the first interposer through hole is formed through the first interposer in the height direction and is in communication with the first board through hole and the second board through hole, and
    wherein the second interposer through hole is formed through the second interposer in the height direction and is in communication with the second board through hole.

8. The electronic device of claim 7, wherein the first interposer through hole is in communication with the second interposer through hole through a gap between the first interposer and the second circuit board.

9. The electronic device of claim 7, wherein
the second interposer through hole does not overlap with the first interposer through hole when viewed from the height direction.

10. The electronic device of claim 7,
wherein the third circuit board further comprises a third board through hole from among the one or more board through holes, the third board through hole is formed through the third circuit board from the fifth board surface to the sixth board surface, and the third board through hole is in communication with the second interposer through hole.

11. The electronic device of claim 10, wherein the second interposer through hole does not overlap with the third board through hole when viewed from the height direction.

12. The electronic device of claim 1, wherein a cross-sectional shape of the one or more board through holes is substantially circular or polygonal when viewed from the height direction, and a cross-sectional shape of the one or more interposer through holes is substantially circular or polygonal when viewed from the height direction.

13. The electronic device of claim 1, wherein at least one of the one or more board through holes and at least one of the one or more interposer through holes overlap when viewed from the height direction and comprise a substantially similar cross-sectional shape when viewed from the height direction.

14. The electronic device of claim 1, wherein the one or more interposers are disposed along a perimeter of the plurality of circuit boards, and
wherein the printed circuit board is configured to receive the non-conductive filler through the one or more board through holes and the one or more interposer through holes in a liquid state and to allow the liquid non-conductive filler to flow through the gap around the perimeter of the plurality of circuit boards.

15. The electronic device of claim 1, wherein, when viewed from the height direction, an edge of the plurality of circuit boards and an edge of the one or more interposers are substantially aligned.

16. A printed circuit board comprising:
a first circuit board comprising a first board surface and a second board surface on a side of the first circuit board that is opposite to the first board surface;
a second circuit board comprising a third board surface that is substantially parallel to the first circuit board and faces the second board surface and a fourth board surface on a side of the second circuit board that is opposite to the third board surface; and
a first interposer disposed between the first circuit board and the second circuit board and connecting the first circuit board to the second circuit board in a height direction that is perpendicular to the first board surface,
wherein a first gap configured to receive a liquid non-conductive filler is formed between the first interposer and the first circuit board, and a second gap configured to receive the liquid non-conductive filler is formed between the first interposer and the second circuit board,
wherein one or more board through holes are formed through at least one of the first circuit board and the second circuit board in the height direction,
wherein the first interposer comprises:
one or more via holes formed in the height direction through the first interposer;
a via disposed within the one or more via holes and configured to electrically connect the first circuit board to the second circuit board; and
one or more first interposer through holes formed in the height direction through the first interposer and configured to respectively communicate with the one or more board through holes, and
wherein the printed circuit board further comprises the non-conductive filler in a non-liquid state disposed within the first gap and the second gap.

17. The printed circuit board of claim 16,
wherein the one or more board through holes comprise at least one of:
a first board through hole formed through the first circuit board from the first board surface to the second board surface; and
a second board through hole formed through the second circuit board from the third board surface to the fourth board surface, and
wherein at least one of the first board through hole and the second board through hole is in communication with at least one of the one or more first interposer through holes.

18. A printed circuit board comprising:
a first circuit board comprising a first board surface, and a second board surface that is on a side of the first circuit board opposite to the first board surface;
a second circuit board comprising a third board surface that is substantially parallel to the first circuit board and faces the second board surface, and a fourth board surface that is on a side of the second circuit board opposite to the third board surface;
a third circuit board comprising a fifth board surface that is substantially parallel to the first circuit board and faces the fourth board surface, and a sixth board surface that is on a side of the third circuit board opposite to the fifth board surface, wherein the second circuit board is disposed between the first circuit board and the third circuit board;
a first interposer disposed between the first circuit board and the second circuit board and connecting the first circuit board to the second circuit board in a height direction that is perpendicular to the first board surface; and
a second interposer disposed between the second circuit board and the third circuit board and connecting the second circuit board to the third circuit board in a height direction that is perpendicular to the third board surface,
wherein the first interposer and the first circuit board are separated by a first gap, the first interposer and the second circuit board are separated by a second gap, the second interposer and the second circuit board are separated by a third gap, and the second interposer and the third circuit board are separated by a fourth gap,
wherein one or more board through holes are formed through at least one of the first circuit board, the second circuit board, and the third circuit board in the height direction,
wherein the first interposer comprises:
a first via hole formed through the first interposer in the height direction;
a first via disposed within the first via hole and configured to electrically connect the first circuit board to the second circuit board; and a first interposer through hole formed through the first interposer in the height direction and configured to communicate with the one or more board through holes, wherein the second interposer comprises:
- a second via hole formed through the second interposer in the height direction;
- a second via disposed within the second via hole and configured to electrically connect the second circuit board to the third circuit board; and
- a second interposer through hole formed through the second interposer in the height direction and configured to communicate with the one or more board through holes, wherein the first gap, the second gap, the third gap, and the fourth gap are configured to receive a non-conductive filler through the one or more board holes and at least one of the first interposer through hole and the second interposer through hole, and wherein the printed circuit board further comprises the non-conductive filler disposed within the first gap, the second gap, the third gap, and the fourth gap.

19. The printed circuit board of claim 18, wherein the one or more board through holes comprise at least one of:
- a first board through hole formed through the first circuit board from the first board surface to the second board surface;
- a second board through hole formed through the second circuit board from the third board surface to the fourth board surface; and
- a third board through hole formed through the third circuit board from the fifth board surface to the sixth board surface, and wherein at least one of the first board through hole, the second board through hole, and the third board through hole is in communication with at least one of the first interposer through hole and the second interposer through hole.

20. The printed circuit board of claim 18, wherein the second interposer through hole does not overlap with the first interposer through hole when viewed from the height direction.

* * * * *